(12) United States Patent
Toriumi

(10) Patent No.: US 9,111,775 B2
(45) Date of Patent: Aug. 18, 2015

(54) SILICON STRUCTURE AND MANUFACTURING METHODS THEREOF AND OF CAPACITOR INCLUDING SILICON STRUCTURE

(75) Inventor: Satoshi Toriumi, Ebina (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/357,040

(22) Filed: Jan. 24, 2012

(65) Prior Publication Data

US 2012/0193632 A1 Aug. 2, 2012

(30) Foreign Application Priority Data

Jan. 28, 2011 (JP) ................. 2011-017086

(51) Int. Cl.
| | | |
|---|---|---|
| H01L 29/24 | (2006.01) | |
| H01L 29/06 | (2006.01) | |
| B82Y 10/00 | (2011.01) | |
| B82Y 40/00 | (2011.01) | |
| H01L 21/02 | (2006.01) | |
| H01L 49/02 | (2006.01) | |

(Continued)

(52) U.S. Cl.
CPC ............ *H01L 29/0665* (2013.01); *B82Y 10/00* (2013.01); *B82Y 30/00* (2013.01); *B82Y 40/00* (2013.01); *H01L 21/0262* (2013.01); *H01L 21/02532* (2013.01); *H01L 21/02592* (2013.01); *H01L 28/84* (2013.01); *H01L 29/94* (2013.01); *H01L 29/945* (2013.01)

(58) Field of Classification Search
CPC ........ B82Y 10/00; B82Y 30/00; B82Y 40/00; H01L 21/02532; H01L 21/02592; H01L 21/0262; H01L 28/84; H01L 29/0665; H01L 29/94; H01L 29/945
USPC ........................................... 257/52
See application file for complete search history.

(56) References Cited

U.S. PATENT DOCUMENTS 6,013,555 A * 1/2000 Yew et al. ..................... 438/398
6,333,227 B1 * 12/2001 Kim et al. ..................... 438/255
6,399,439 B1 6/2002 Yamanishi et al.
(Continued)

FOREIGN PATENT DOCUMENTS

| JP | 05-315543 | 11/1993 |
|---|---|---|
| JP | 11-168188 | 6/1999 |
| JP | 2010-147412 | 7/2010 |

*Primary Examiner* — Ermias Woldegeorgis
*Assistant Examiner* — Benjamin Tzu-Hung Liu
(74) *Attorney, Agent, or Firm* — Eric J. Robinson; Robinson Intellectual Property Law Office, P.C.

(57) ABSTRACT

Provided is a silicon structure with a three-dimensionally complex shape. Further provided is a simple and easy method for manufacturing the silicon structure with the use of a phenomenon in which an ordered pattern is formed spontaneously to form a nano-structure. Plasma treatment under hydrogen atmosphere is performed on an amorphous silicon layer and the following processes are performed at the same time: a reaction process for growing microcrystalline silicon on a surface of the silicon layer and a reaction process for etching the amorphous silicon layer which is exposed, so that a nano-structure including an upper structure in a microcrystalline state and a lower structure in an amorphous state, over the silicon layer is formed; accordingly, a silicon structure with a three-dimensionally complex shape can be provided.

12 Claims, 19 Drawing Sheets

(51) Int. Cl.
*H01L 29/94* (2006.01)
*B82Y 30/00* (2011.01)

(56) References Cited

U.S. PATENT DOCUMENTS

| | | | |
|---|---|---|---|
| 6,603,160 B1* | 8/2003 | Zhang | 257/288 |
| 7,361,578 B2* | 4/2008 | Gu | 438/482 |
| 7,611,930 B2 | 11/2009 | Yamazaki et al. | |
| 7,642,157 B2* | 1/2010 | Yates et al. | 438/255 |
| 7,906,393 B2* | 3/2011 | Zheng et al. | 438/255 |
| 8,876,937 B2 | 11/2014 | Peng et al. | |
| 8,901,715 B1 | 12/2014 | Popp | |
| 8,906,727 B2 | 12/2014 | Evans et al. | |
| 8,907,210 B2 | 12/2014 | Meissner et al. | |
| 2002/0086493 A1 | 7/2002 | Kubota et al. | |
| 2003/0162373 A1 | 8/2003 | Goto et al. | |
| 2009/0139447 A1 | 6/2009 | Toriumi | |
| 2009/0142909 A1 | 6/2009 | Jinbo et al. | |

* cited by examiner

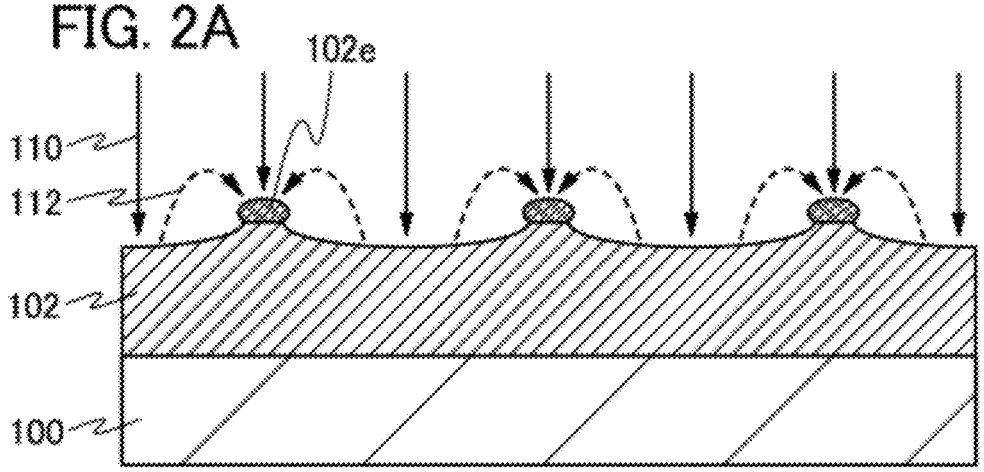
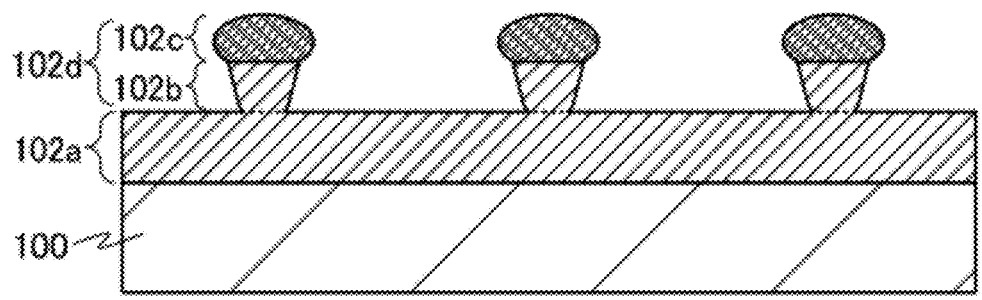

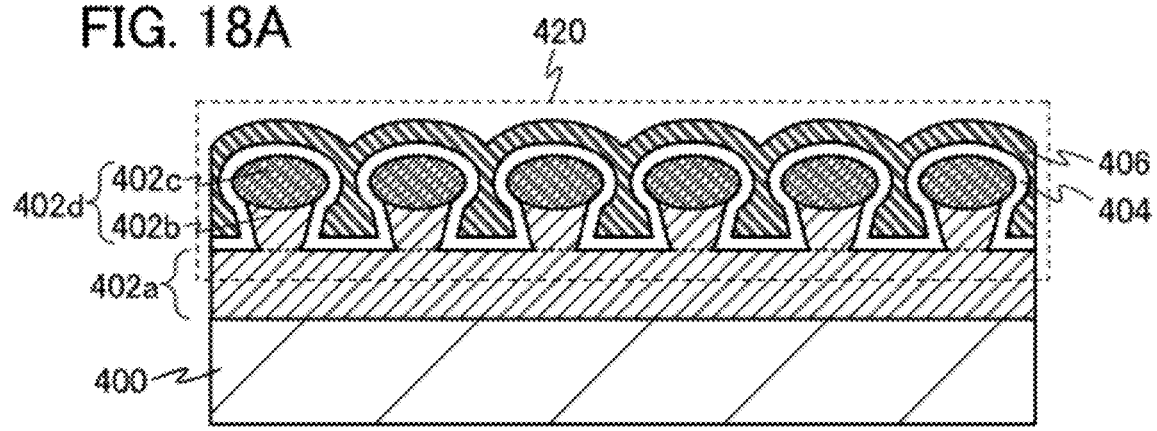
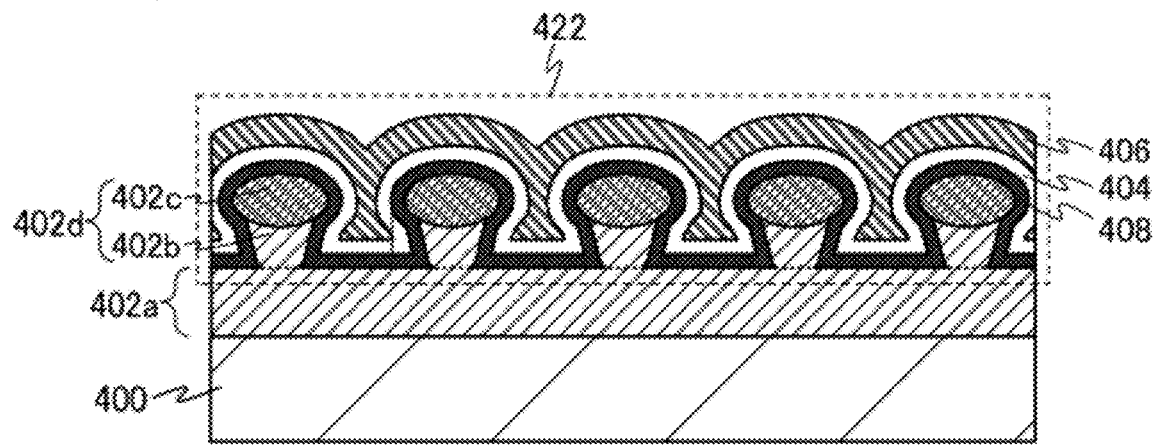

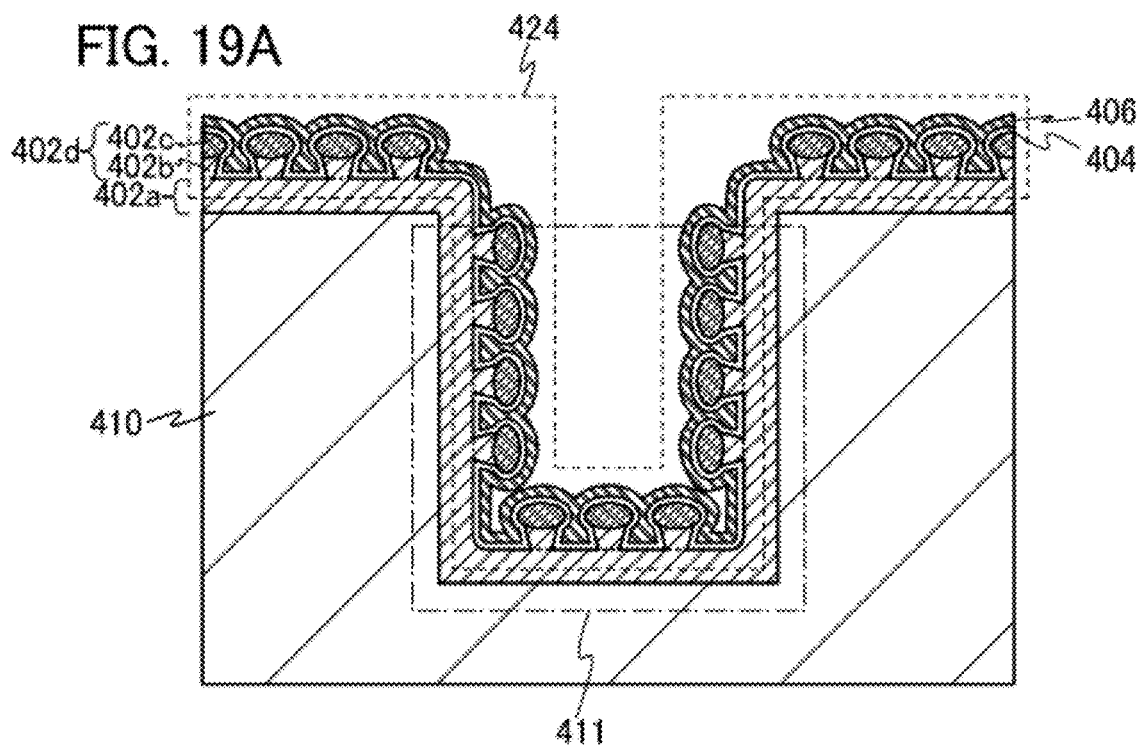
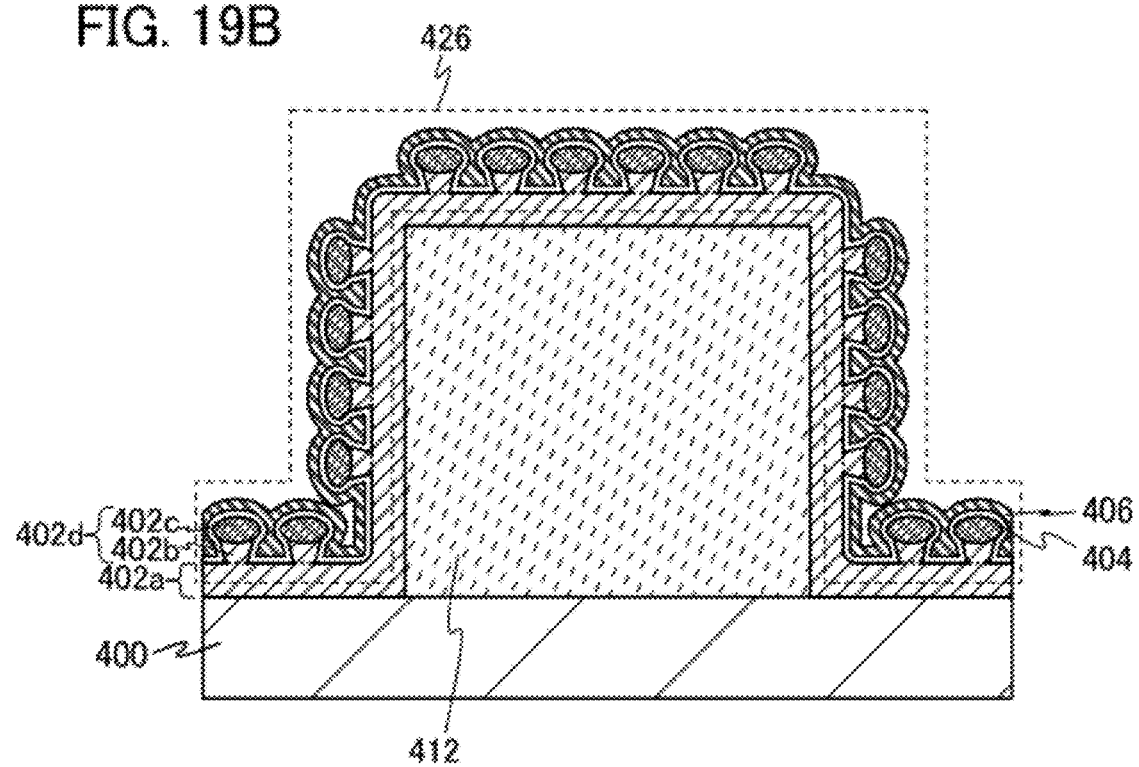

US 9,111,775 B2

SILICON STRUCTURE AND MANUFACTURING METHODS THEREOF AND OF CAPACITOR INCLUDING SILICON STRUCTURE

BACKGROUND OF THE INVENTION

1. Field of the Invention

The present invention relates to a silicon structure, a method for manufacturing the silicon structure, and a method for manufacturing a capacitor including the silicon structure.

2. Description of the Related Art

In recent years, accuracy of microfabrication technique has been improving steadily, a nano-meter scale structure (a nano-structure) and nano-technology for manufacturing the nano-structure have attracted attention in a variety of electronics fields. As a method for manufacturing the nano-structure, a method in which a pattern is directly formed with a lithography technique using light or an electron beam is often used.

As a contrasting method, there is a method utilizing a phenomenon in which an ordered pattern is formed spontaneously to form a nano-structure without using an artificial technique such as a lithography technique. Since a nano-structure is formed by utilizing such a phenomenon, a pattern does not need to be formed directly, so that nano-structures can be formed simply and easily in a large area.

As an example of a nano-structure, there is hemispherical-grain-silicon (HSG-Si) (for example, Patent Document 1). The HSG-Si is a hemispherical polysilicon grain. In Patent Document 1, the HSG-Si is formed on an electrode surface of a capacitor to increase a surface area of the electrode and thus storage capacitance is increased.

REFERENCE

[Patent Document 1] Japanese Published Patent Application No. H5-315543

SUMMARY OF THE INVENTION

A technique for forming a three-dimensional nano-structure whose shape is not so complex such as hemispherical polysilicon disclosed in Patent Document 1 has been already disclosed. However, few techniques for forming a nano-structure with a more three-dimensionally complex shape (for example, a shape with three-dimensional swelling and constriction) have been disclosed compared to the above.

Particularly, in the case where a surface area of an electrode surface of a capacitor is increased by forming a projection and a depression of the nano-structure, as disclosed in Patent Document 1, the nano-structure is formed to have a three-dimensionally complex shape with swelling and constriction and thus the surface area can be further increased.

In view of the above, an object of one embodiment of the present invention is to provide a silicon layer including a three-dimensionally complex nano-structure (hereinafter, referred to as "silicon structure"). Another object of one embodiment of the present invention is to provide a method for manufacturing the silicon structure simply and easily, utilizing a phenomenon in which an ordered pattern is formed spontaneously to form a nano-structure.

Plasma treatment under hydrogen atmosphere is performed on an amorphous silicon layer and the following processes are performed at the same time: a reaction process for growing microcrystalline silicon on a surface of the silicon layer and a reaction process for etching the amorphous silicon layer which is exposed, so that a nano-structure including an upper structure in a microcrystalline state and a lower structure in an amorphous state is formed over the silicon layer. Specifically, the following structures can be employed, for example.

An embodiment of the present invention includes an amorphous silicon layer and a plurality of nano-structures formed over a surface of the amorphous silicon layer. The nano-structure comprises a lower structure containing amorphous silicon and an upper structure containing microcrystalline silicon and overlapping with the lower structure. In the silicon structure, the maximum width of the lower structure in the horizontal direction, which is the direction substantially parallel to the surface of the amorphous silicon layer, is smaller than or equal to the maximum width of the upper structure in the horizontal direction, in the cross section of the lower structure and the upper structure.

It is preferable that a width in the horizontal direction is gradually reduced from a peripheral portion of the upper structure having the maximum width in the horizontal direction to the lower structure in the cross section of the lower structure and the upper structure. In addition, a silicon atom contained in the lower structure and a silicon atom contained in the amorphous silicon layer preferably form a covalent bond. Further, a top surface of the upper structure is preferably curved. Furthermore, an impurity element imparting one conductivity type may be added to the amorphous silicon layer and the nano-structure.

Another embodiment of the present invention is a capacitor including the silicon structure, an insulating layer over the silicon structure, and an electrode layer over the insulating layer. In addition, another embodiment of the present invention is a capacitor including the silicon structure, a first electrode layer over the silicon structure, an insulating layer over the first electrode layer, and a second electrode layer over the insulating layer.

Another embodiment of the present invention is a method for manufacturing a silicon structure by performing plasma treatment under hydrogen atmosphere on an amorphous silicon layer to grow microcrystalline silicon on a surface of the amorphous silicon layer, so that a plurality of upper structures is formed, and at the same time, to etch the amorphous silicon layer which is exposed, so that a plurality of lower structures under the plurality of upper structures is formed, thereby a plurality of nano-structures each comprising the upper structure and the lower structure over the amorphous silicon layer is formed.

In the plasma treatment, it is preferable that the pressure be 5 kPa or more and the power is 1000 W or more. In addition, in the plasma treatment, it is preferable that the pressure be 20 kPa or less and the power is 2000 W or less. Further, in the plasma treatment, it is preferable that the substrate temperature be 200° C. to 300° C. It is preferable that the deposition of the amorphous silicon and the plasma treatment be successively performed without exposure to the air.

Plasma treatment under hydrogen atmosphere is performed on an amorphous silicon layer and the following processes are performed at the same time: a reaction process for growing microcrystalline silicon on a surface of the silicon layer and a reaction process for etching the amorphous silicon layer which is exposed, so that a nano-structure including an upper structure in a microcrystalline state and a lower structure in an amorphous state, over the silicon layer is formed; accordingly, a silicon structure with a three-dimensionally complex shape can be provided.

In addition, with the above method, the silicon structure can be manufactured simply and easily with the use of a

BRIEF DESCRIPTION OF THE DRAWINGS

FIGS. 2A and 2B are cross-sectional views illustrating a method for manufacturing a silicon structure in accordance with an embodiment of the present invention.

FIGS. 18A and 18B are cross-sectional views illustrating/ of a capacitor in accordance with an embodiment of the present invention.

FIGS. 19A and 19B are cross-sectional views illustrating/ of a capacitor in accordance with an embodiment of the present invention.

DETAILED DESCRIPTION OF THE INVENTION

Figure 1A:
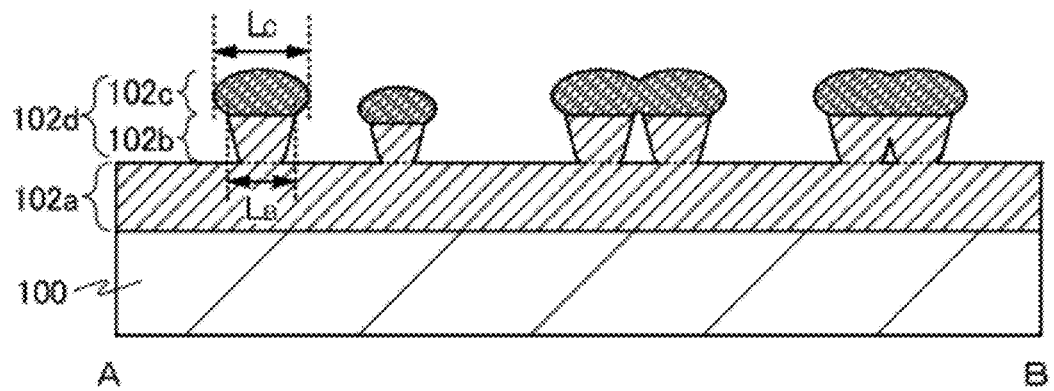
FIGS. 1A and 1B are a cross-sectional view and a plan view illustrating a silicon structure in accordance with an embodiment of the present invention.

Embodiments of the present invention will be described below with reference to the accompanying drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in structures of the present invention described hereinafter, like portions or portions having similar functions are denoted by the same reference numerals in different drawings, and description thereof is not repeated.

Note that in each drawing described in this specification, the size, the layer thickness, or the region of each component is exaggerated for clarity in some cases. Therefore, embodiments of the present invention are not limited to such scales.

Embodiment 1

In this embodiment, a silicon structure and a manufacturing method thereof in accordance with an embodiment of the present invention will be described with reference to FIGS. 1A and 1B, FIGS. 2A and 2B, and FIG. 3.

Figure 1B:
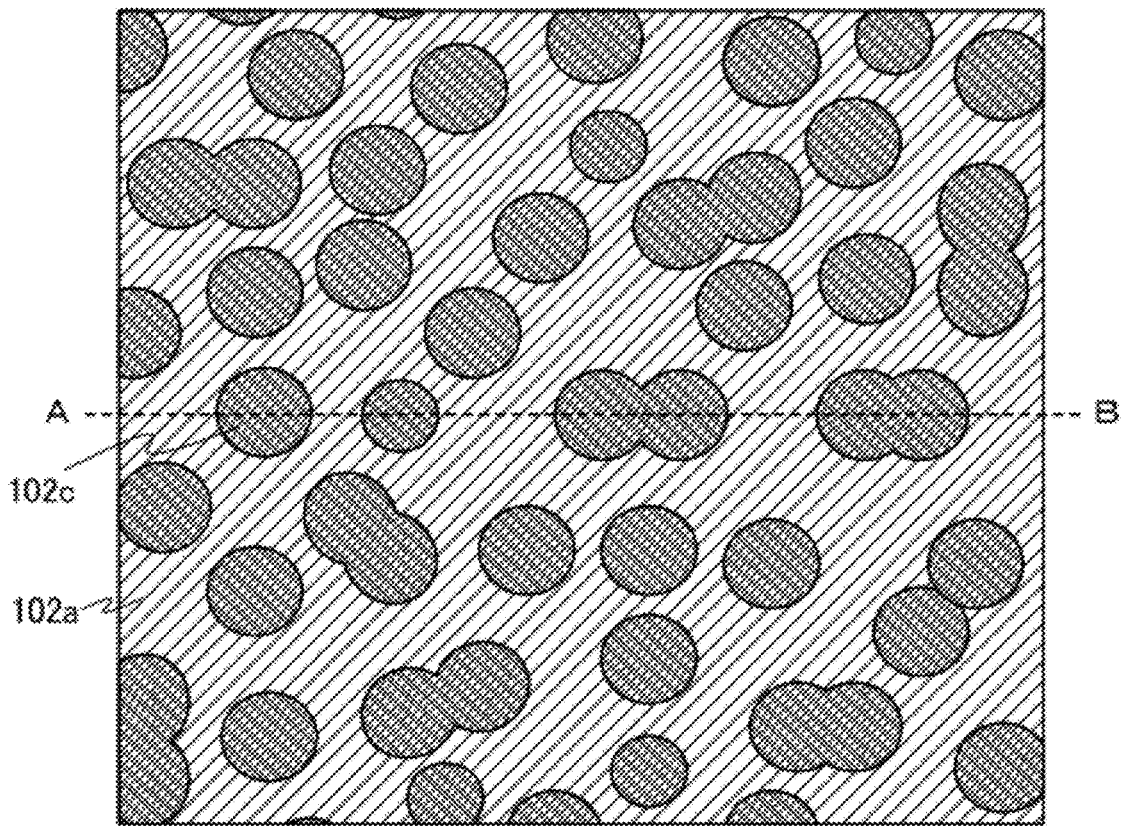

First, the silicon structure in accordance with an embodiment of the present invention will be described with reference to FIGS. 1A and 1B. FIG. 1A illustrates a cross section of the silicon structure in accordance with an embodiment of the present invention. FIG. 1B is a plan view of the silicon structure in accordance with an embodiment of the present invention. Here, the cross-sectional view of FIG. 1A corresponds to a dashed line A-B in FIG. 1B.

The silicon structure illustrated in FIGS. 1A and 1B includes an amorphous silicon layer 102a over a support 100 and a plurality of nano-structures 102d formed over the amorphous silicon layer 102a. The nano-structure 102d comprises a lower structure 102b containing amorphous silicon and an upper structure 102c containing microcrystalline silicon and overlapping with the lower structure 102b. As illustrated in FIG. 1A, a maximum width $L_B$ of the lower structure 102b in the horizontal direction is smaller than or equal to a maximum width $L_C$ of the upper structure 102c in the horizontal direction, in the cross section of the lower structure 102b and the upper structure 102c.

The amorphous silicon layer 102a is formed of silicon having an amorphous structure and contains hydrogen. The concentration of hydrogen in the amorphous silicon layer 102a is preferably higher than or equal to $1 \times 10^{20}$ atoms/cm$^3$. Note that the amorphous silicon layer 102a is not completely amorphous, and may partly contain a different crystal structure such as a microcrystalline structure. For example, a surface of the amorphous silicon layer 102a may partly contain microcrystalline silicon.

In addition, the support 100 over which the amorphous silicon layer 102a is formed may be formed using any material capable of withstanding the plasma treatment described below, and for example, a substrate which is formed of an insulator, such as a glass substrate, a ceramic substrate, a plastic substrate, a quartz substrate, or a sapphire substrate; a substrate formed of a semiconductor such as silicon, a substrate formed of a conductor such as metal or stainless steel, or the like can be used. Further, an insulating film, a conductive film, an element layer using these films, or the like may be formed over the support 100 as necessary, and then, the amorphous silicon layer 102a may be formed thereover. Note that a surface of the support 100 is flat in this embodiment; however, the surface shape of the support 100 is not limited thereto, and the surface of the support 100 may be uneven.

The lower structure 102b contains amorphous silicon. As described later, an amorphous silicon layer is etched so that the lower structure 102b and the amorphous silicon layer 102a are formed. Thus, a silicon atom contained in the lower structure 102b and a silicon atom contained in the amorphous silicon layer 102a are bonded with each other with a covalent bond.

The lower structure 102b also contains hydrogen, as the amorphous silicon layer 102a, at preferably higher than or equal to $1\times10^{20}$ atoms/cm$^3$. Note that the lower structure 102b is not completely amorphous, and may partly contain a different crystal structure such as a microcrystalline structure. For example, a surface of the lower structure 102b may partly contain microcrystalline silicon and a boundary between the lower structure 102b and the upper structure 102c may contain microcrystalline silicon. Note that in the lower structure 102b, an amorphous silicon region is larger than a microcrystalline silicon region. Accordingly, in electron diffraction intensity analysis, a concentric circular halo pattern is observed in the lower structure 102b.

The upper structure 102c contains microcrystalline silicon. "Microcrystalline silicon" in this specification is silicon having an intermediate structure between an amorphous structure and a crystalline structure (including a single crystal structure and a polycrystalline structure). Microcrystalline silicon has a third state that is stable in terms of free energy and has short-range order and lattice distortion, in which column-like or needle-like crystal grains having a diameter of 2 nm to 200 nm, preferably 10 nm to 80 nm, further preferably 20 nm to 50 nm grow in a direction normal to the substrate surface. Thus, there is a case where crystal grain boundaries are formed at the interface of the columnar or needle-like crystal grains. Note that the crystal grain diameter here means a maximum diameter of a crystal grain in a plan parallel to the surface of the support 100. Further, the crystal grain includes an amorphous silicon region and a crystallite which is a minute crystal that can be regarded as a single crystal. The crystal grain may include a twin crystal.

Microcrystalline silicon has a peak of Raman spectrum which is shifted to a lower wave number than 520 cm$^{-1}$ that represents single crystal silicon. In other words, the peak of the Raman spectrum of the microcrystalline silicon is between 520 cm$^{-1}$ which represents single crystal silicon and 480 cm$^{-1}$ which represents amorphous silicon. In addition, microcrystalline silicon contains hydrogen or halogen at 1 at. % or more in order to terminate dangling bonds.

Note that the upper structure 102c is not completely microcrystalline, and may partly contain a different crystal structure such as an amorphous structure. For example, a surface of the upper structure 102c may partly contain amorphous silicon and a boundary between the lower structure 102b and the upper structure 102c may contain amorphous silicon. Note that in the upper structure 102c, a microcrystalline silicon region is larger than an amorphous silicon region. Accordingly, in electron diffraction intensity analysis, a plurality of spots corresponding to lattice points is observed in the diffraction pattern of the upper structure 102c.

Further, one or a plurality of the amorphous silicon layer 102a, the lower structure 102b, and the upper structure 102c may have conductivity by addition of an impurity element imparting one conductivity type. It is preferable that at least one element be selected from Group 13 or Group 15 of the periodic table as an impurity element imparting one conductivity type. For example, in the case of imparting n-type conductivity, phosphorus or arsenic can be used, and in the case of imparting p-type conductivity, boron can be used.

The nano-structure 102d comprises the lower structure 102b and the upper structure 102b overlapping with the lower structure 102b. The maximum width $L_B$ of the lower structure 102b in the horizontal direction is smaller than or equal to the maximum width $L_C$ of the upper structure 102c in the horizontal direction, in the cross section of the lower structure 102b and the upper structure 102c. That is, in a cross section of the nano-structure 102d, the upper structure 102c extends beyond an edge of the lower structure 102b. Thus, the nano-structure 102d has a three-dimensionally complex shape with swelling and constriction caused by the formation of the lower structure 102b and the upper structure 102c.

In addition to such a shape of the nano-structure 102d, the lower structure 102b is in an amorphous state and the upper structure 102c is in a microcrystalline state; thus, a layer in which a plurality of lower structures 102b is formed has a density smaller than that of a layer in which a plurality of upper structures 102c is formed. Accordingly, in a cross-section scanning transmission electron microscope (STEM) image and the like of the cross-sectional view of FIG. 1A, contrast is clearly shown between the layer in which a plurality of upper structures 102c is formed and the layer in which a plurality of lower structures 102b is formed.

In addition, it is preferable that, in the cross section of the lower structure 102b, the width in the horizontal direction be gradually decreased from the upper structure 102c side to the amorphous silicon layer 102a side. That is, the cross-sectional shape of the lower structure 102b is preferably a substantially trapezoid in which the upper base is longer than the lower base. In addition, the upper surface of the lower structure 102b is covered with the upper structure 102c, and the planar shape of the lower structure 102b is similar to that of the upper structure 102c and is smaller than that of the upper structure 102c.

Note that a boundary between the lower structure 102b and the amorphous silicon layer 102a is not clear. Here, a surface including a bottom surface between the lower structures 102b is treated as the boundary between the lower structure 102b and the amorphous silicon layer 102a.

It is preferable that in the upper structure 102c, a side surface is curved so that the width in the horizontal direction is increased from the center of the top surface to the peripheral portion where the upper structure 102c has the maximum width $L_C$ in the horizontal direction, and also is curved so that the width in the horizontal direction is decreased from the peripheral portion to the lower structure 102b.

It is preferable that the upper structure 102c overlaps with and covers the lower structure 102b, and a planar shape of the upper structure 102c is similar to that of the lower structure 102b and is larger than that of the lower structure 102b. In addition, the planar shape of the upper structure 102c is substantially a circular shape as illustrated in FIG. 1B in many cases; however, the planar shape of the upper structure 102c is not limited thereto.

Note that a boundary between the lower structure 102b and the upper structure 102c is not clear. Here, in the cross section of the lower structure 102b and the upper structure 102c, the boundary between the lower structure 102b and the upper structure 102c is considered to exist at least between a region where the width of the lower structure 102b in the horizontal direction is the maximum width $L_B$ and a region where the width of the upper structure 102c in the horizontal direction is the maximum width $L_C$. As described above, in electron diffraction intensity analysis, a concentric circular halo pattern is observed in the lower structure 102b, and the diffraction pattern of the upper structure 102c has a plurality of spots corresponding to lattice points; accordingly, the boundary between the lower structure 102b and the upper structure 102c can be determined based on the difference in electron diffraction pattern.

As illustrated in FIGS. 1A and 1B, a plurality of nano-structures 102d is arranged irregularly over the amorphous silicon layer 102a. Further, as illustrated in FIGS. 1A and 1B, the plurality of nano-structures 102d may be different in size. Furthermore, as illustrated in FIGS. 1A and 1B, the plurality of nano-structures 102d may be bonded to the adjacent nano-structures 102d at the lower structure 102b or the upper structure 102c.

According to one embodiment of the present invention, a silicon structure with a three-dimensionally complex nano-structure described above can be provided. With such a three-dimensionally complex nano-structure, the surface area of a silicon layer can be increased compared to that of a silicon layer which is flat.

For example, the silicon structure is provided below an electrode of a capacitor so that the electrode of the capacitor has a shape similar to that of the silicon structure; thus, the surface area of the electrode of the capacitor element can be increased without increasing the planar area of the electrode of the capacitor. Accordingly, storage capacitance can be increased without increasing the planar area of the capacitor. In addition, as described above, by adding an impurity element imparting one conductivity type to the silicon structure so that the silicon structure has conductivity, the silicon structure can be directly used as the electrode of the capacitor.

Next, a method for manufacturing a silicon structure in accordance with one embodiment of the present invention and a mechanism thereof will be described with reference to FIGS. 2A and 2B and FIG. 3.

First, an amorphous silicon layer 102 is formed over the support 100. The amorphous silicon layer 102 can be formed using silicon hydride such as monosilane or disilane by a thin film deposition method such as a CVD method (including a plasma CVD method, a thermal CVD method, and the like) and a sputtering method.

Note that the amorphous silicon layer 102 contains hydrogen as described above, at preferably higher than or equal to $1 \times 10^{20}$ atoms/cm$^3$. Therefore, it is preferable to employ a CVD method, further preferably a plasma CVD method. This is because it is difficult to make the amorphous silicon layer 102 contain hydrogen by a sputtering method. By a plasma CVD method, the amorphous silicon layer 102 can be formed at relatively low temperature. Consequently, hydrogen can be contained sufficiently in the formed amorphous silicon layer 102. In this manner, hydrogen is sufficiently contained in the amorphous silicon layer 102; thus, the amorphous silicon layer 102 can be easily etched in hydrogen plasma treatment performed later.

When hydrogen at a flow rate of 1 to 20 times, preferably 1 to 10 times, further preferably 1 to 5 times as high as that of silicon hydride is used, the amorphous semiconductor layer 102 containing hydrogen can be formed. Further, plasma generated in a plasma CVD method can be stabilized with dilution of the silicon hydride with one or plural kinds of rare gas elements selected from helium, argon, krypton, and neon.

Note that the thickness of the amorphous silicon layer 102 is preferably 50 nm to 500 nm, further preferably 70 nm to 200 nm.

Figure 3:
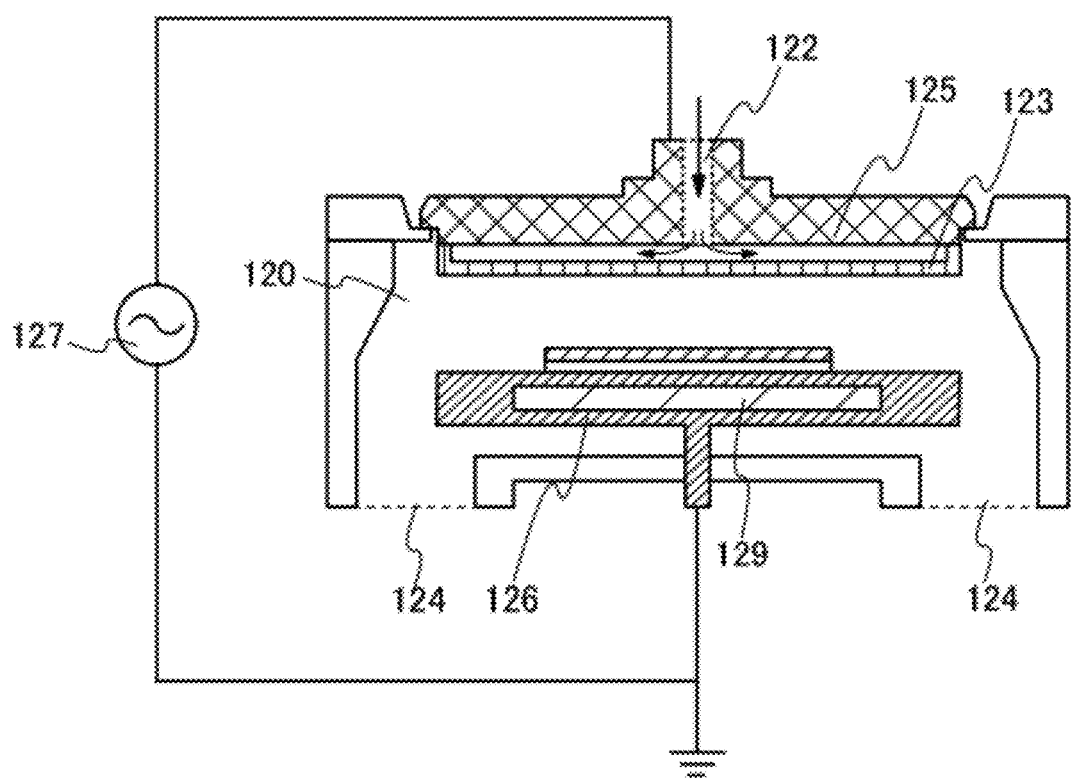
FIG. 3 is a cross-sectional view illustrating a PCVD apparatus in accordance with an embodiment of the present invention.

When the amorphous silicon layer 102 is formed by a plasma CVD method in this manner, a parallel plate (capacitively coupled) plasma CVD apparatus illustrated in FIG. 3 can be used, for example. The plasma CVD apparatus shown in FIG. 3 includes a treatment chamber 120, a gas supply portion 122, a shower plate 123, exhaust ports 124, an upper electrode 125, a lower electrode 126, an RF power source 127, and a temperature controller 129.

When treatment is performed with the plasma CVD apparatus illustrated in FIG. 3, a given gas is supplied from the gas supply portion 122 provided in the upper electrode 125. The gas is introduced evenly throughout the treatment chamber 120 through the shower plate 123. High-frequency power is applied with the RF power source 127 connected to the upper electrode 125 and the lower electrode 126 to excite the gas in the treatment chamber 120, thereby generating plasma. Here, the distance between the upper electrode 125 and the lower electrode 126 can be adjusted by moving the lower electrode 126 up and down. Further, the temperature controller 129 provided in the lower electrode 126 makes it possible to perform plasma treatment while an object is being heated. Further, the gas in the treatment chamber 120 is exhausted through the exhaust ports 124 that are connected to a vacuum pump. For example, a turbo-molecular pump, a dry pump, or the like can be used as the vacuum pump. In addition, an automatic pressure control (APC) system, such as a butterfly valve, is preferably provided between each of the exhaust ports 124 and the vacuum pump.

In this embodiment, the amorphous silicon layer 102 with a thickness of 100 nm is formed using the plasma CVD apparatus illustrated in FIG. 3, under the following conditions: the distance between electrodes is 25 mm, the diameter of the electrode is 227.3 mm, the pressure is 170 Pa, the frequency of a high frequency (RF) power source is 13.56 MHz, the power is 30 W, the deposition time is 210 seconds, and the flow rates of deposition gases are SiH$_4$: 280 sccm and H$_2$: 300 sccm.

The description of FIG. 1A can be referred to for the description of the support 100. In this embodiment, the support 100 is formed of a glass substrate and a silicon nitride film formed thereover as a base insulating film.

Next, plasma treatment under hydrogen atmosphere (hereinafter, referred to as hydrogen plasma treatment) is performed on the amorphous silicon layer 102. The hydrogen plasma treatment is preferably performed using a plasma CVD apparatus, further preferably a parallel plate plasma CVD apparatus. Thus, the hydrogen plasma treatment is preferably performed using a parallel plate plasma CVD apparatus as illustrated in FIG. 3.

Further, the hydrogen plasma treatment is performed under higher pressure atmosphere and higher power than in an ordinary plasma CVD method and an ordinary plasma treatment which are performed using a parallel plate plasma CVD apparatus. The hydrogen plasma treatment is preferably performed in the following conditions: the pressure in a treatment chamber is 5 kPa or more, and the power applied to an electrode is 1000 W or more; further preferably, the pressure in a treatment chamber is 10 kPa or more, and the power applied to an electrode is 1300 W or more. Note that an electrode applied with the power is assumed to have a diameter of 227.3 mm, an area of 40580 mm$^2$, and a circular shape. Thus, the power per area of 1 mm$^2$ is preferably 24.64 mW/mm$^2$ or more, further preferably 32.04 mW/mm$^2$ or more in the hydrogen plasma treatment.

In addition, in such a hydrogen plasma treatment under high pressure and high power using a parallel plate plasma CVD apparatus, high density plasma may be caused between electrodes in the plasma CVD apparatus. Thus, the electrodes in a plasma CVD apparatus might be heated excessively and there is a risk with reducing the pressure in the treatment chamber to atmospheric pressure without careful consideration. Accordingly, it is preferable that the pressure in the treatment chamber is 20 kPa or lower, the power applied to an electrode is 2000 W or lower, and the power per area of 1 mm$^2$ is 49.29 mW/mm$^2$ or lower in the hydrogen plasma treatment, in consideration of the possibility of damage on the plasma CVD apparatus.

Further, in the hydrogen plasma treatment, the hydrogen is diluted with one or plural kinds of rare gas elements selected from helium, argon, krypton, and neon, so that plasma generated by the plasma treatment can be stabilized. Note that the flow rate of a rare gas in the hydrogen plasma treatment is preferably lower than or equal to the flow rate of a hydrogen gas.

The hydrogen plasma treatment is further preferably performed at a substrate temperature in the range of 200° C. to 300° C. Here, the substrate temperature is set lower, so that the rate of forming the lower structure 102b can be improved.

In this embodiment, the hydrogen plasma treatment on the amorphous silicon layer 102 is performed using the plasma CVD apparatus illustrated in FIG. 3, under the following conditions: the distance between electrodes is 7 mm, the diameter of the electrode is 227.3 mm, the pressure is 10000 Pa, the frequency of a high frequency (RF) power source is 13.56 MHz, the power is 1300 W, the deposition time is 600 seconds, the flow rate of a gas is $H_2$: 3000 sccm, and the substrate temperature is 300° C.

Here, a formation mechanism of the silicon structure illustrated in FIGS. 1A and 1B in the hydrogen plasma treatment will be described with reference to FIGS. 2A and 2B.

The silicon structure in accordance with an embodiment of the present invention is formed by performing the following processes at the same time in the hydrogen plasma treatment: a reaction process for growing microcrystalline silicon on a surface of the amorphous silicon layer 102 and a reaction process for etching the surface of the amorphous silicon layer 102 which is exposed.

As illustrated in FIG. 2A, when plasma is generated under hydrogen gas atmosphere, a hydrogen radical 110 is generated, and then, the amorphous silicon layer 102 over the support 100 is etched by the hydrogen radical 110. Bond dissociation of silicon atoms in the amorphous silicon layer 102 is caused by damage by the hydrogen radical 110, so that the silicon atoms are detached from the amorphous silicon layer 102, become a radical 112 containing silicon, and is released from the amorphous silicon layer 102. Here, silicon atoms are bonded to each other in the amorphous silicon layer 102, and in addition to that, a bond may be terminated with a hydrogen atom, or a dangling bond with no atom to be bonded may exist in the amorphous silicon layer 102. The radical 112 containing silicon includes a radical in which 1 to 3 hydrogen atoms is/are bonded to 1 silicon atom such as a SiH radical, $SiH_2$ radical, or $SiH_3$ radical. In addition, a radical whose hydrogen atom is bonded to a plurality of silicon atoms may be included in the radical 112 containing silicon.

Then, the radical 112 containing silicon which is released to the treatment chamber is deposited on the surface of the amorphous silicon layer 102. The deposited silicon repeats dissociation of an unstable bond between silicon atoms and rearrangement of silicon atoms, by the hydrogen radical 110 so that the silicon grows to have a stable structure; as a result, a crystal nucleus 102e of microcrystalline silicon is formed.

The etching rate of the amorphous silicon layer 102 is higher than that of the crystal nucleus 102e of microcrystalline silicon under hydrogen plasma atmosphere. Thus, part of a surface of the amorphous silicon layer 102 where the crystal nucleus 102e is not formed and which is exposed is selectively etched and the amorphous layer 102 under the crystal nucleus 102e is left. On the other hand, in the crystal nucleus 102e, microcrystalline silicon grows by bonding to the radical 112 containing silicon which is released by the etching of the amorphous silicon layer 102.

In this manner, the crystal nucleus 102e of microcrystalline silicon grows, so that the upper structure 102c is formed, and the amorphous silicon layer under the upper structure 102c is etched to be hollowed; as a result, the lower structure 102b is formed in a portion where the amorphous silicon layer is left. Accordingly, the maximum width $L_B$ of the lower structure 102b in the horizontal direction is smaller than or equal to the maximum width $L_C$ of the upper structure 102c in the horizontal direction, in the cross section of the lower structure 102b and the upper structure 102c.

Here, since the hydrogen plasma treatment is performed under high pressure atmosphere as described above, the density of a hydrogen gas between electrodes in a plasma CVD apparatus can be increased; thus, plasma can be generated with high density between the electrodes, that is, in the periphery of the amorphous silicon layer 102. In addition, since the hydrogen plasma treatment is performed under high power as described above, sufficient energy can be supplied to a hydrogen gas in an area where plasma is generated, so that the hydrogen gas can be sufficiently brought into a radical state. Accordingly, a sufficient amount of hydrogen radical is produced, so that the growth rate of microcrystalline silicon at the surface of the amorphous silicon layer 102 can be sufficiently increased.

In such a plasma treatment, a hydrogen ion is also formed in addition to a hydrogen radical, and there is a possibility that the microcrystalline silicon is etched by the hydrogen ion accelerated by an electric field between electrodes. However, since the hydrogen plasma treatment is performed under high pressure atmosphere as described above, the hydrogen ion collides with another hydrogen ion or the like immediately, so that the hydrogen ion cannot obtain enough kinetic energy; thus, the risk of etching the microcrystalline silicon can be reduced. This can be applied to the etching rate of the amorphous silicon layer 102. In other words, since the hydrogen plasma treatment is performed under high pressure atmosphere as described above, the amorphous silicon layer 102 is prevented from being etched immediately by the hydrogen ion accelerated by an electric field between electrodes, so that the etching rate of the amorphous silicon layer 102 can be stable.

Accordingly, it is possible to keep a balance between the growth rate of microcrystalline silicon at the surface of the amorphous silicon layer 102 and the etching rate of the surface of the amorphous silicon layer 102. Thus, such a problem that only the amorphous silicon layer 102 is etched due to too fast etching rate of the amorphous silicon layer 102 can be prevented.

In this manner, as illustrated in FIG. 2B, the plurality of upper structures 102c is formed by the reaction process for growing microcrystalline silicon on the surface of the amorphous silicon layer 102, and at the same time, the plurality of lower structures 102b can be formed under the plurality of upper structures 102c by the reaction process for etching the exposed surface of the amorphous silicon layer 102. Consequently, the plurality of nano-structures 102d formed of the lower structure 102b and the upper structure 102c is formed over the amorphous silicon layer 102a over the support 100.

In addition, the deposition of the amorphous silicon layer 102 and the hydrogen plasma treatment on the amorphous silicon layer 102 are preferably performed successively without exposure to the air. Further, when a base insulating film is formed over the support 100, the base insulating film is also preferably formed successively without exposure to the air. In this manner, the formation of a silicon structure is performed successively without exposure to the air, so that an impurity or the like can be prevented from being contained in the silicon structure.

With the above method, the silicon structure with the three-dimensionally complex nano-structure can be easily manufactured utilizing a phenomenon in which an ordered pattern is formed spontaneously to form a nano-structure. When the three-dimensionally complex nano-structure is formed using a lithography technique such as photolithography as described above, a plurality of masks needs to be used; however, such a process is unnecessary in the method for manufacturing the silicon structure in this embodiment, so that throughput can be increased and cost can be reduced.

Further, the silicon structure can be formed only by a plasma CVD method and plasma treatment in the method for manufacturing the silicon structure in this embodiment, so that temperature required for the manufacturing process can be relatively low temperature, around 200° C. to 300° C. Accordingly, a glass substrate whose heat-resistance temperature is relatively low, or the like can be easily used for a support over which the silicon structure is formed.

The methods and structures described in this embodiment can be combined as appropriate with any of the methods and structures described in the other embodiments.

Embodiment 2

In this embodiment, an example in which a capacitor is formed using the silicon structure described in Embodiment 1 will be described with reference to FIGS. 18A and 18B and FIGS. 19A and 19B.

FIG. 18A illustrates a cross-sectional view of a capacitor 420 according to an embodiment of the present invention. The capacitor 420 in FIG. 18A includes an amorphous silicon layer 402a provided over a support 400, a plurality of nano-structures 402d formed over the amorphous silicon layer 402a, an insulating layer 404 formed over the amorphous silicon layer 402a and the plurality of nano-structures 402d, and an electrode layer 406 formed over the insulating layer 404. Each nano-structure 402d includes a lower structure 402b containing amorphous silicon and an upper structure 402c containing microcrystalline silicon and overlapping with the lower structure 402b. Here, the amorphous silicon layer 402a and the plurality of nano structures 402d have conductivity by addition of an impurity element imparting one conductivity type. That is, in the capacitor 420 in FIG. 18A, the amorphous silicon layer 402a and the plurality of nano-structures 402d serve as one electrode of the capacitor 420, the electrode layer 406 serves as the other electrode of the capacitor 420, and the insulating layer 404 serves as a dielectric of the capacitor 420.

Note that the support 400 corresponds to the support 100 in Embodiment 1, the amorphous silicon layer 402a corresponds to the amorphous silicon layer 102a in Embodiment 1, the lower structure 402b corresponds to the lower structure 102b in Embodiment 1, the upper structure 402c corresponds to the upper structure 102c in Embodiment 1, and the nano-structure 402d corresponds to the nano-structure 102d in Embodiment 1, and thus Embodiment 1 can be referred to for the details. Materials for the insulating layer 404 and the electrode layer 406 may be selected in accordance with performance required for the capacitor 420 as appropriate.

In addition, a base insulating film, a wiring layer, and a semiconductor element such as a transistor may be provided between the support 400 and the amorphous silicon layer 402 depending on the intended purpose of the capacitor 420.

In such a manner, a silicon structure with a three-dimensionally complex nano-structure is used as one electrode of a capacitor and thus the surface area of the electrode of the capacitor can be increased as compared to the case of using a flat silicon layer. Accordingly, storage capacitance of the capacitor can be increased without increasing the planar area of the capacitor.

In the capacitor 420, the silicon structure with the three-dimensionally complex nano-structure is used as one electrode of the capacitor; however, the capacitor described in this embodiment is not limited thereto. A capacitor 422 which is different from the capacitor 420 will be illustrated in FIG. 18B. The capacitor 422 includes the amorphous silicon layer 402a provided over the support 400, the plurality of nano-structures 402d formed over the amorphous silicon layer 402a, an electrode layer 408 formed over the amorphous silicon layer 402a and the plurality of nano-structures 402d, the insulating layer 404 formed over the electrode layer 408, and the electrode layer 406 formed over the insulating layer 404. Each nano-structure 402d comprises a lower structure 402b containing amorphous silicon and an upper structure 402c containing microcrystalline silicon and overlapping with the lower structure 402b. That is, in the capacitor 422 in FIG. 18B, the electrode layer 408 serves as one electrode of the capacitor 422, the electrode layer 406 serves as the other electrode of the capacitor 422, and the insulating layer 404 serves as a dielectric of the capacitor 422.

In other words, the capacitor 422 is different from the capacitor 420 in that the electrode layer 408 is formed. The other structures are similar to those in the capacitor 420 and thus the description of the capacitor 420 can be referred to for the details. Note that in the capacitor 422, the amorphous silicon layer 402a and the nano-structures 402d do not necessarily serve as electrodes and thus do not necessarily have conductivity. Materials for the insulating layer 404, the electrode layer 406, and the electrode layer 408 may be selected in accordance with performance required for the capacitor 422 as appropriate.

In such a manner, an electrode layer formed over a silicon structure and reflecting a three-dimensionally complex shape is used as one electrode of a capacitor and thus the surface area of the electrode of the capacitor can be increased as compared to the case of using a flat electrode layer. Accordingly, storage capacitance of the capacitor can be increased without increasing the planar area of the capacitor.

The capacitor 420 and the capacitor 422 are each provided over the flat support 400; however, the capacitors described in this embodiment are not limited thereto. For example, as illustrated in FIG. 19A, a capacitor 424 may be formed to be in contact with a bottom surface and an inner wall surface of a trench 411 which is formed in the support 410. In addition, as illustrated in FIG. 19B, a capacitor 426 may be formed to be in contact with a top surface and a side surface of a convex structure 412 over the support 400. Here, the convex structure 412 may be a conductor or an insulator and may be formed using appropriate materials in accordance with performance required for the capacitor 426. Note that in FIGS. 19A and 19B, the capacitor 424 and the capacitor 426 each include, as the capacitor 420, the amorphous silicon layer 402a, the nano-structure 402d comprising the lower structure 402b and the upper structure 402c, the insulating layer 404, and the electrode layer 406; however, the structures of the capacitor 424 and the capacitor 426 are not limited thereto, and the structure similar to that of the capacitor 422 may be employed.

The silicon structure described in this embodiment is formed without using a lithography technique such as photolithography, the silicon structure can be formed relatively easily on the inner wall surface of the trench 411 and the side surface of the convex structure 412. In this manner, a silicon structure with a three-dimensionally complex nano-structure is formed on an inner wall surface of a trench and a side surface of a convex structure and is used as one electrode of a capacitor; thus, the surface area of electrodes of the capacitor can be further increased. Accordingly, storage capacitance of the capacitor can be increased without increasing the planar area of the capacitor.

Further, the silicon structure in this embodiment can be formed only by a plasma CVD method and plasma treatment, so that temperature required for the manufacturing process can be relatively low temperature, around 200° C. to 300° C. Accordingly, a glass substrate whose heat-resistance temperature is relatively low, or the like can be easily used for a support over which the silicon structure is formed. For example, in the case where a display portion and a driver circuit portion are formed over one glass substrate in a display device or the like, the capacitor described in this embodiment can be provided in the driver circuit portion together with transistors in the display portion and the driver circuit portion.

The methods and structures described in this embodiment can be combined as appropriate with any of the methods and structures described in the other embodiments.

Example 1

In this example, a silicon structure according to the present invention is manufactured and results of observing the silicon structure will be described.

In this example, a sample A in which a silicon nitride layer is formed over a glass substrate and a silicon structure is further formed over the silicon nitride layer was formed. As a comparative example, a sample B in which an amorphous silicon layer which is flat is formed instead of the silicon structure was formed. The samples were manufactured by the following methods.

First, a 300-nm-thick silicon nitride layer was formed over the glass substrate by a plasma CVD method. The silicon nitride layer was formed using the parallel plate plasma CVD apparatus as illustrated in FIG. 3 under the following conditions: the distance between electrodes was 26 mm, the diameter of the electrode was 227.3 mm, the pressure was 1000 Pa, the frequency of a high frequency (RF) power source was 13.56 MHz, the power was 200 W, the deposition time was 462 seconds, the flow rates of gasses were $SiH_4$: 15 sccm, $H_2$: 200 sccm, $N_2$: 180 sccm, and $NH_3$: 500 sccm, the upper electrode temperature was 200° C., and the substrate temperature was 300° C.

Next, an 100-nm-thick amorphous silicon layer was formed over the silicon nitride layer by a plasma CVD method. The amorphous silicon layer was formed using the parallel plate plasma CVD apparatus as illustrated in FIG. 3 under the following conditions: the distance between electrodes was 25 mm, the diameter of the electrode was 227.3 mm, the pressure was 170 Pa, the frequency of a high frequency (RF) power source was 13.56 MHz, the power was 30 W, the deposition time was 210 seconds, and the flow rates of gasses were $SiH_4$: 280 sccm and $H_2$: 300 sccm. In this manner, the silicon nitride layer was formed over the glass substrate, and further the flat amorphous silicon layer was formed over the silicon nitride layer, and thus the sample B was completed.

Further, the hydrogen plasma treatment described in the above embodiment was performed on the sample A. The hydrogen plasma treatment was performed using the parallel plate plasma CVD apparatus as illustrated in FIG. 3 under the following conditions: the distance between electrodes was 7 mm, the diameter of the electrode was 227.3 mm, the pressure was 10000 Pa, the frequency of a high frequency (RF) power source was 13.56 MHz, the power was 1300 W, the deposition time was 600 seconds, the flow rate of a gas was $H_2$: 3000 sccm, and the substrate temperature was 300° C. In this manner, the silicon nitride layer was formed over the glass substrate, and further the silicon structure was formed over the silicon nitride layer, and thus the sample A was completed.

For the sample A and the sample B, phase contrast images (TE images) of cross sections of the samples were taken using a scanning transmission electron microscope (STEM), and secondary electron images (SE images) of plans of the samples were taken using a scanning electron microscope (SEM).

Figure 4A:
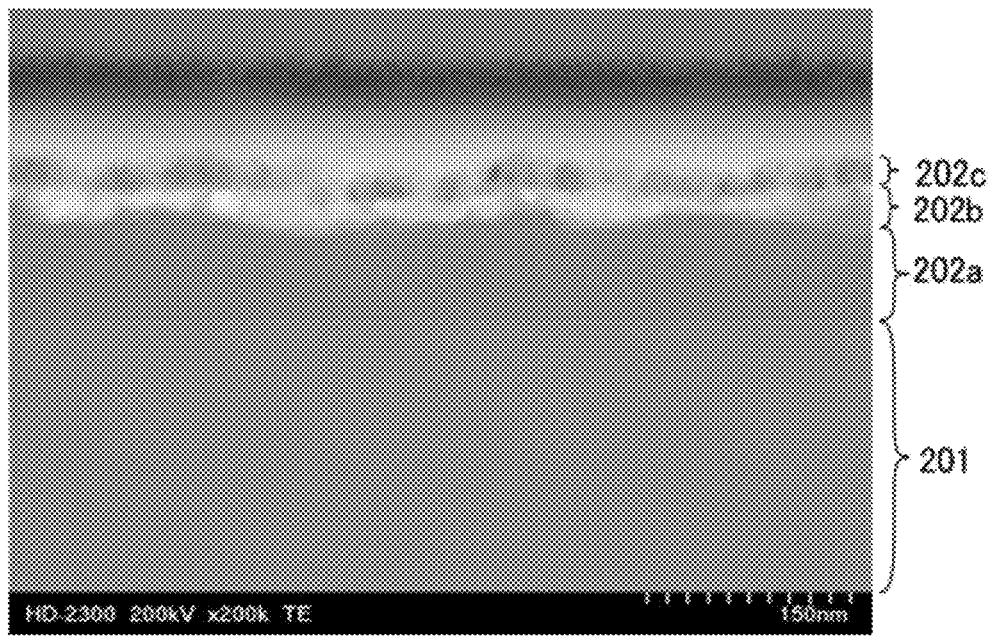
FIGS. 4A and 4B are cross-sectional TE images in accordance with Example 1 of the present invention.
Figure 4B:
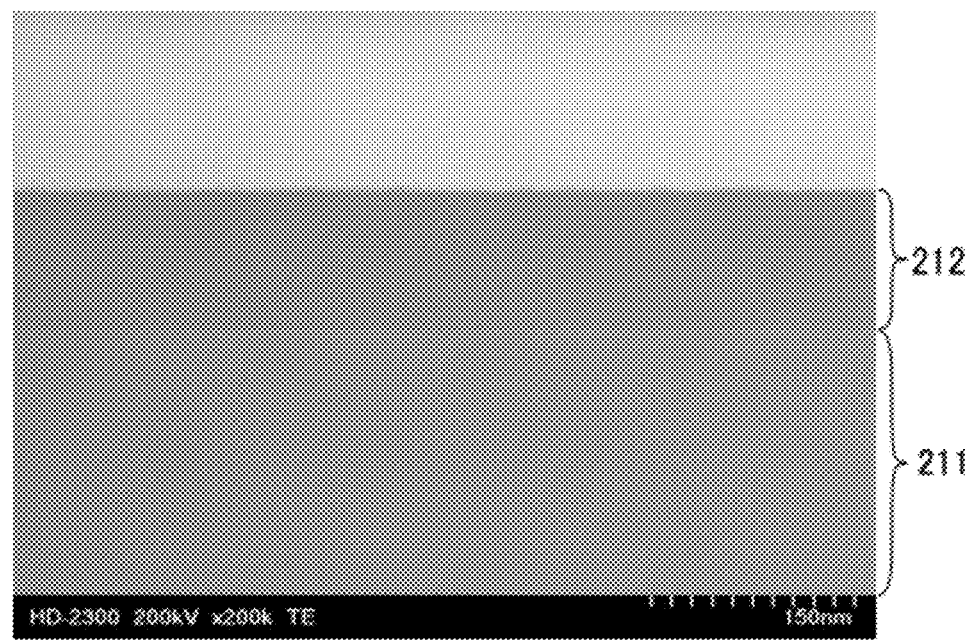
Figure 5A:
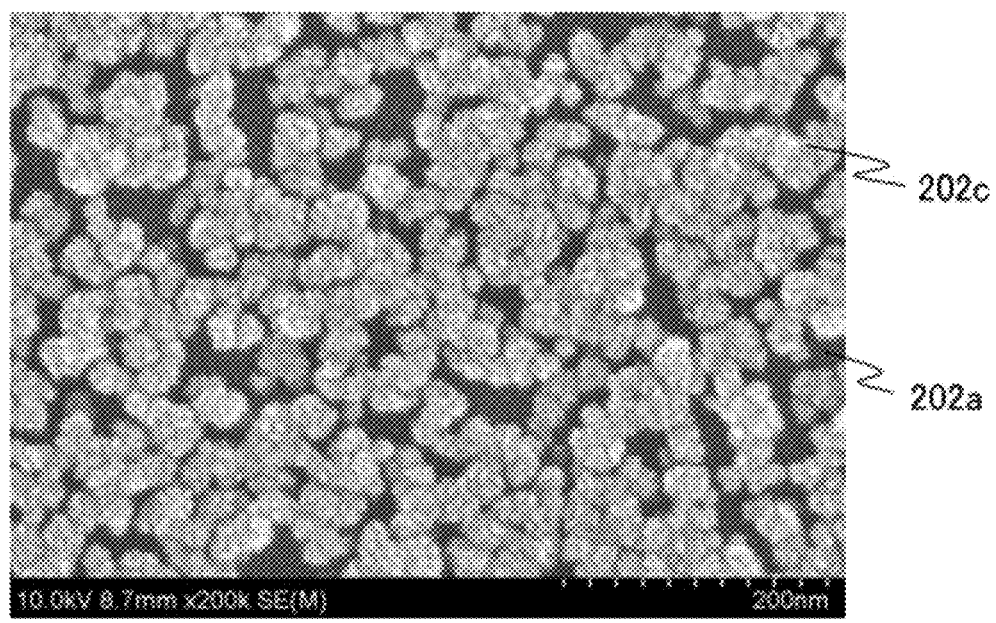
FIGS. 5A and 5B are plan SE images in accordance with Example 1 of the present invention.
Figure 5B:
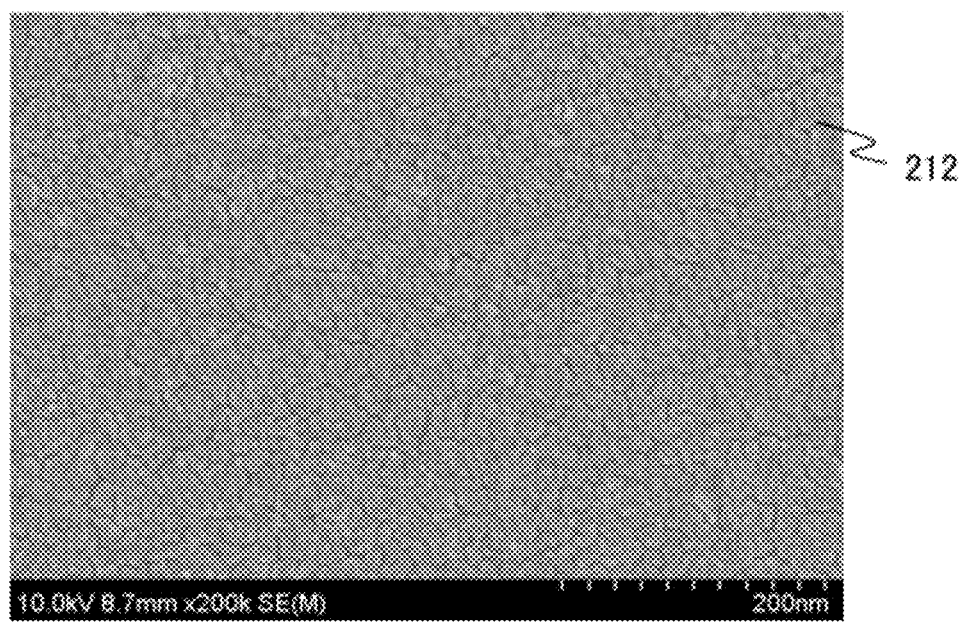
Figure 6A:
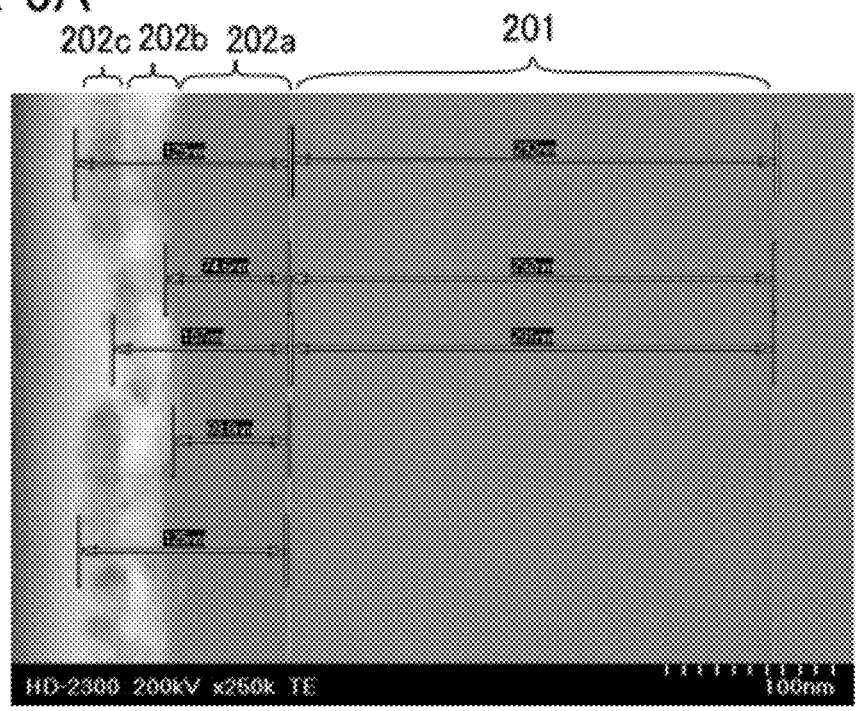
FIGS. 6A and 6B are cross-sectional TE images in accordance with Example 1 of the present invention.
Figure 6B:
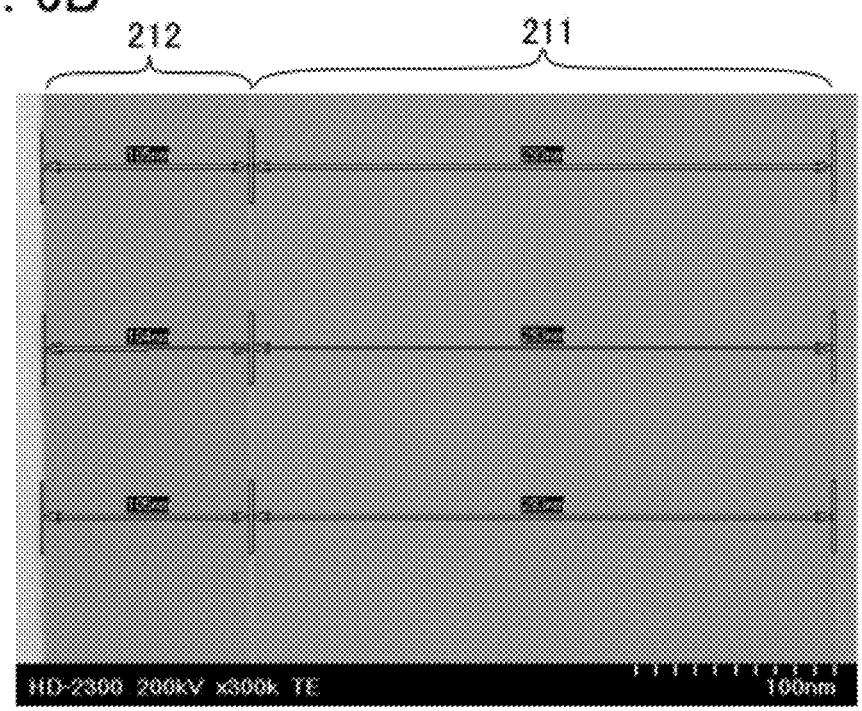

FIG. 4A is a TE image (a magnification of 200000 times) of the sample A. FIG. 4B is a TE image (a magnification of 200000 times) of the sample B. FIG. 5A is an SE image (a magnification of 200000 times) of the sample A. FIG. 5B is an SE image (a magnification of 200000 times) of the sample B. FIG. 6A is a TE image (a magnification of 250000 times) of the sample A. FIG. 6B is a TE image (a magnification of 250000 times) of the sample B.

The TE images in this example were taken using HD-2300 manufactured by Hitachi High-Technologies Corporation, with an acceleration voltage of 200 kV. The SE images in this example were taken using S-4800 manufactured by Hitachi High-Technologies Corporation, with an acceleration voltage of 200 kV.

As shown in FIG. 4B, the sample B includes a silicon nitride layer 211 over a glass substrate and an amorphous silicon layer 212 which is flat over the silicon nitride layer 211. On the other hand, as shown in FIG. 4A, the sample A includes a silicon nitride layer 201 over a glass substrate, an amorphous silicon layer 202a over the silicon nitride layer 201, a lower structure 202b over the amorphous silicon layer 202a, and an upper structure 202c over the lower structure 202b. That is, the sample A includes the silicon structure described in the above embodiment. Note that over the upper structure 202c, a protective film in which a carbon coat and a platinum coat are stacked is provided for taking a TE image. As in a TE image and an SE image described below, a protective film in which a carbon coat and a platinum coat are stacked is provided over a sample.

In a TE image, a contrast is created due to interference between an electron beam passed through a sample and an electron beam whose phase is deviated by being scattered by the sample; thus, contrast of the TE image is determined according to density distribution in the sample. Accordingly, the silicon nitride layer 201 and the amorphous silicon layer 202a in FIG. 4A and the silicon nitride layer 211 and the amorphous silicon layer 212 in FIG. 4B have large densities and their density distributions vary less. On the other hand, in a layer in which the upper structure 202c and the lower structure 202b are formed in FIG. 4A, density distribution varies. That is, in bright parts of the layer in which the lower structure 202b and the upper structure 202c are formed, cavities are formed.

Dark parts are formed in clusters in the upper structure 202c, and columnar dark parts are formed in the lower structure 202b so as to be located below and overlap with the dark parts in clusters in the upper structure 202c. It is found that the number of bright parts, that is, the number of cavities is larger in the layer in which the lower structure 202b is formed than in the layer in which the upper structure 202c is formed. Further, the dark part in the upper structure 202c is darker than the dark part in the lower structure 202b, that is, the density of the upper structure 202c is higher than that of the lower structure 202b. It is supposed that the upper structure 202c is mainly formed of microcrystalline silicon and the lower structure 202b is mainly formed of amorphous silicon.

In addition, as shown in FIG. 6B, the amorphous silicon layer 212 is formed with a thickness about 105 nm over the silicon nitride layer 211 in the sample B, which can be applied to the sample A before the hydrogen plasma treatment is performed. On the other hand, in FIG. 6A, the thickness of the amorphous silicon layer 202a is about 70 nm, and a total thickness of the amorphous silicon layer 202a, the lower structure 202b, and the upper structure 202c is about 130 nm at a maximum and about 100 nm at a minimum. In other words, it is supposed that the amorphous silicon layer 202a is etched by about 30 nm and that microcrystalline silicon included in the upper structure 202c grows by about 30 nm.

Further, on the surface of the sample B, as shown in FIG. 5B, only the amorphous silicon layer 212 was observed; however, on the surface of the sample A, as shown in FIG. 5A, the upper structure 202c comprising microcrystalline silicon and the amorphous silicon layer 202a which is exposed between the upper structures 202c were observed. The reason why the distance between the upper structures 202c in FIG. 5A seems smaller than the distance between the upper structures 102c in FIG. 1B is that a platinum coat formed over the upper structure 202c in FIG. 5A is also shot; the actual distance between the upper structures 202c is larger than in FIG. 5A.

Accordingly, it is found that a nano-structure formed of the lower structure 202b over the amorphous silicon layer 202a and the upper structure 202c overlapping with the lower structure 202b is formed in the sample A, and that, in the cross section of the nano-structure, the maximum width of the lower structure 202b in the horizontal direction is smaller than or equal to the maximum width of the upper structure 202c in the horizontal direction.

Figure 7:
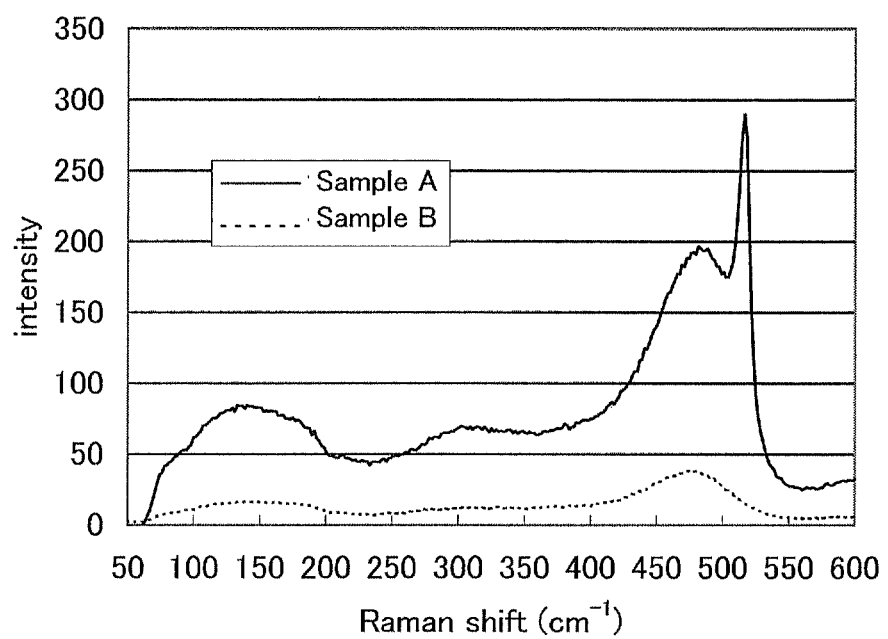
FIG. 7 is a Raman spectrum in accordance with Example 1 of the present invention.

FIG. 7 shows results of Raman spectrum measurement of the sample A and the sample B, using Raman spectroscopic analysis. In FIG. 7, the vertical axis indicates the Raman scattering intensity (arbitrary unit), and the horizontal axis indicates the Raman shift ($cm^{-1}$).

The Raman spectrum of sample B shows a round peak of Raman shift at about 480 $cm^{-1}$. As in the case of the sample B, the Raman spectrum of the sample A also shows a round peak of Raman shift at about 480 $cm^{-1}$, and further, shows a sharp peak of Raman shift at about 516 $cm^{-1}$.

The round peak of Raman shift at about 480 $cm^{-1}$ observed in both the sample A and the sample B is due to amorphous silicon. It is considered that the sharp peak of Raman shift at about 516 $cm^{-1}$, which is observed only in the sample A, is due to microcrystalline silicon contained in the upper structure 202c, because the sharp peak is shifted to the lower wave number than the peak of Raman shift at 520 $cm^{-1}$, which is seen in single crystal silicon.

Accordingly, it can be said that the silicon structure according to the present invention contains both amorphous silicon and microcrystalline silicon.

In addition, for a sample C and a sample D in each of which a silicon structure is manufactured by the hydrogen plasma treatment at a substrate temperature different from that in the sample A, TE images of cross sections of the samples are taken using a STEM. The substrate temperatures in the sample C and the sample D were 250° C. and 200° C., respectively, and the other conditions were similar to those for the sample A.

Figure 8A:
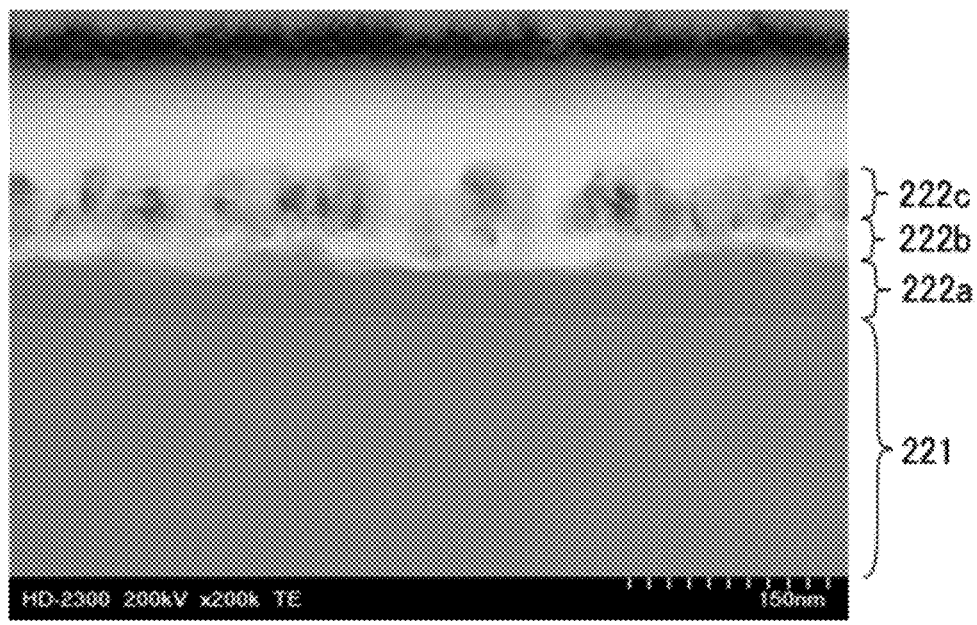
FIGS. 8A and 8B are cross-sectional TE images in accordance with Example 1 of the present invention.
Figure 8B:
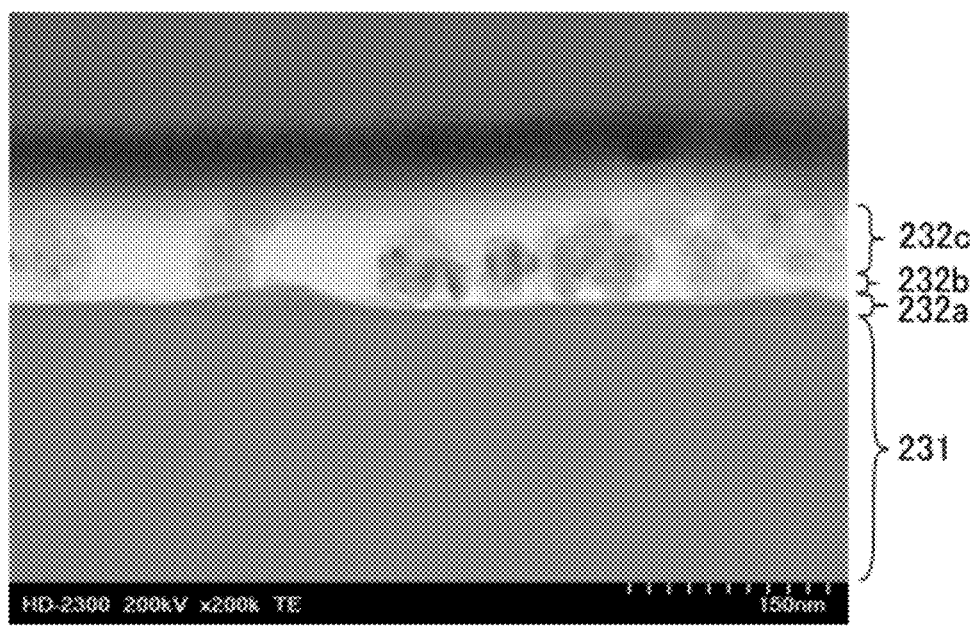

FIG. 8A is a TE image (a magnification of 200000 times) of the sample C. FIG. 8B is a TE image (a magnification of 200000 times) of the sample D.

As the sample A, the sample C in FIG. 8A includes a silicon nitride layer 221 over a glass substrate, an amorphous silicon layer 222a over the silicon nitride layer 221, a lower structure 222b over the amorphous silicon layer 222a, and an upper structure 222c over the lower structure 222b. Further, as the sample A, the sample D in FIG. 8B includes a silicon nitride layer 231 over a glass substrate, an amorphous silicon layer 232a over the silicon nitride layer 231, a lower structure 232b over the amorphous silicon layer 232a, and an upper structure 232c over the lower structure 232b.

Note that the thickness of the amorphous silicon layer 222a of the sample C is smaller than that of the amorphous silicon layer 202a of the sample A, and the amorphous silicon layer 232a of the sample D is much thinner than these. The upper structure 222c of the sample C and the upper structure 232c of the sample D are larger than the upper structure 202c of the sample A. Further, in FIG. 8B, in a layer in which the upper structure 232c is formed, a large cavity is observed, which is considered to be left after microcrystalline silicon is released.

Considering that the substrate temperatures in the hydrogen plasma treatment are lowered in this order: the sample A, the sample C, the sample D, the substrate temperatures in the hydrogen plasma treatment are set in the range of 200° C. to 300° C.; thus, the growth rate of microcrystalline silicon and the etching rate of amorphous silicon are supposed to be stable. It is further supposed that the growth rate of microcrystalline silicon and the etching rate of amorphous silicon can be improved by reducing the substrate temperatures in that range.

Example 2

In this example, a silicon structure according to the present invention is formed in various conditions, and results of observing the silicon structures will be described.

In this example, as comparative examples, a sample E in which a silicon nitride layer is formed over a glass substrate and an amorphous silicon layer which is flat is further formed over the silicon nitride layer was formed, and samples F to K in each of which silicon structures were formed using a method similar to that of the sample E under pressure and power in the hydrogen plasma treatment which were different.

The sample E was formed using a method similar to that of the sample B. The sample K was formed using a method similar to that of the sample A. The samples F to J were formed with pressure and power in the hydrogen plasma treatment which were different from those in the sample A. The sample F was formed under a pressure of 1000 Pa and a power of 1000 W, the sample G was formed under a pressure of 5000 Pa and a power of 1000 W, the sample H was formed under a pressure of 10000 Pa and a power of 1000 W, the sample I was formed under a pressure of 1000 Pa and a power of 1300 W, and the sample J was formed under a pressure of 5000 Pa and a power of 1300 W. Other conditions were similar to those in the sample A.

For the samples E to K, optical images of plans of the samples were taken, and phase contrast images (TE images) of the cross sections or secondary electron images (SE images) of the cross sections of the samples were taken using a STEM.

Figure 9A:
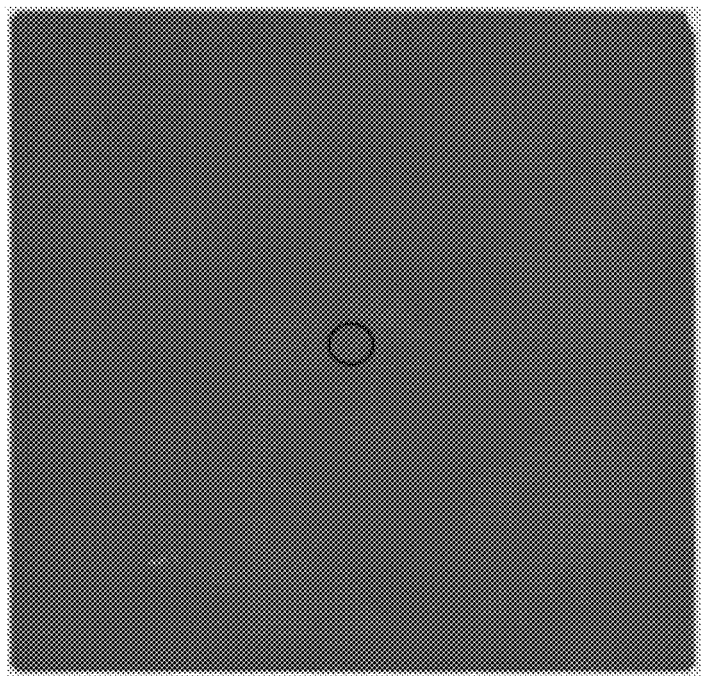
FIGS. 9A and 9B are an optical image and a cross-sectional TE image in accordance with Example 2 of the present invention.
Figure 9B:
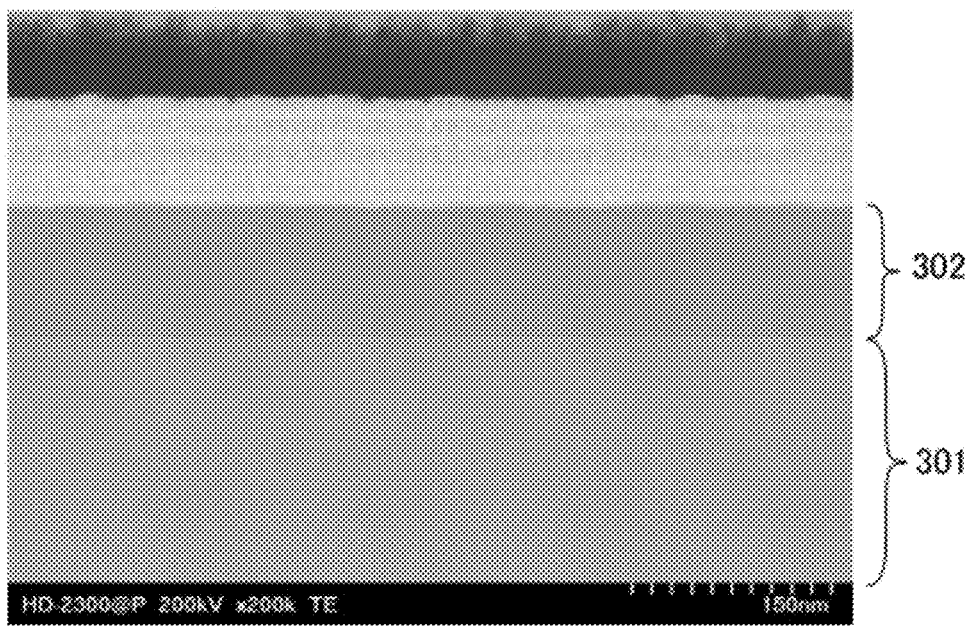
Figure 10A:
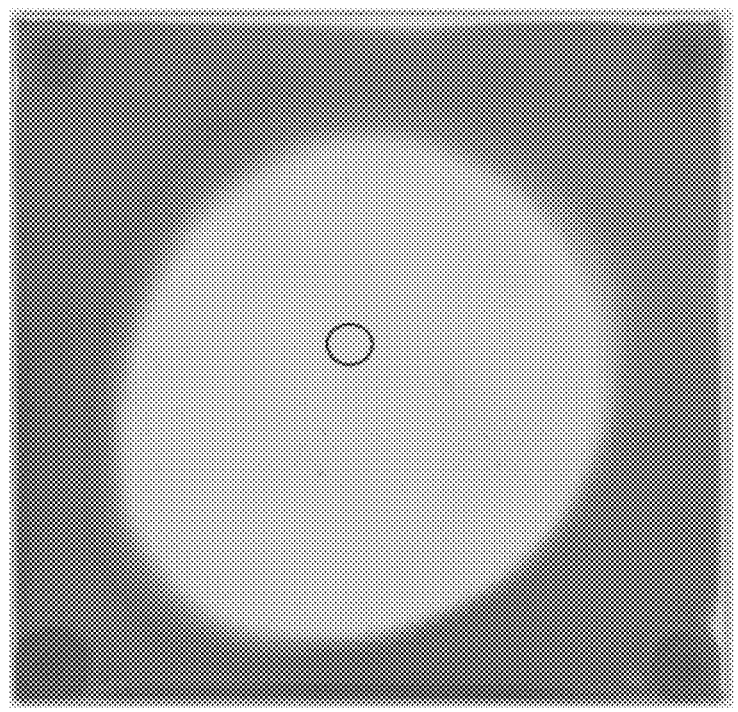
FIGS. 10A and 10B are an optical image and a cross-sectional TE image in accordance with Example 2 of the present invention.
Figure 10B:
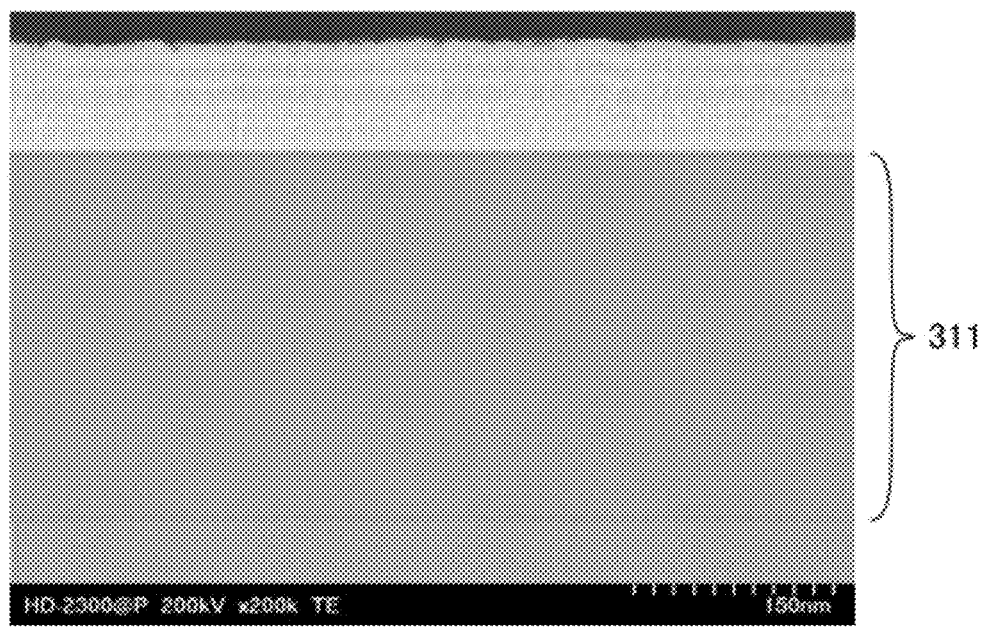
Figure 11A:
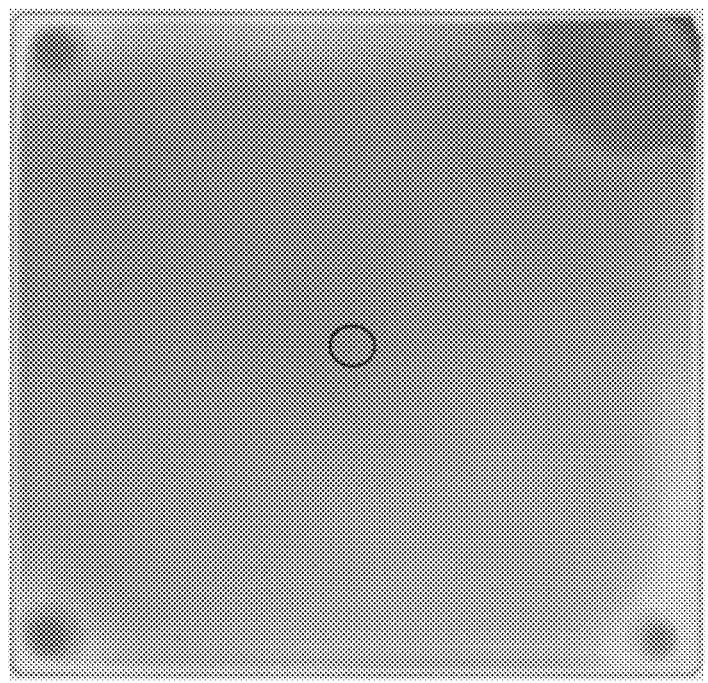
FIGS. 11A and 11B are an optical image and a cross-sectional TE image in accordance with Example 2 of the present invention.
Figure 11B:
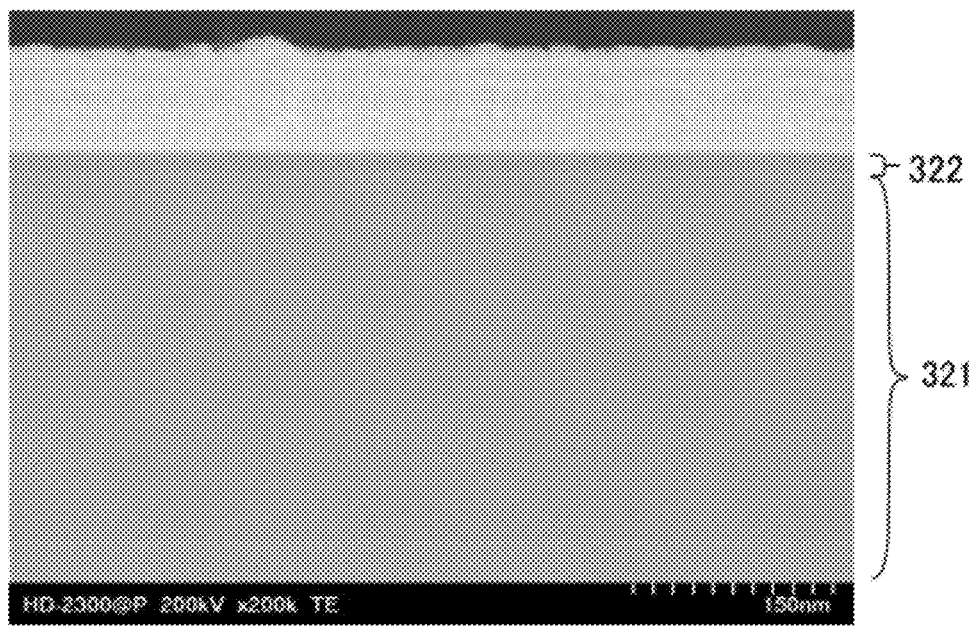
Figure 12A:
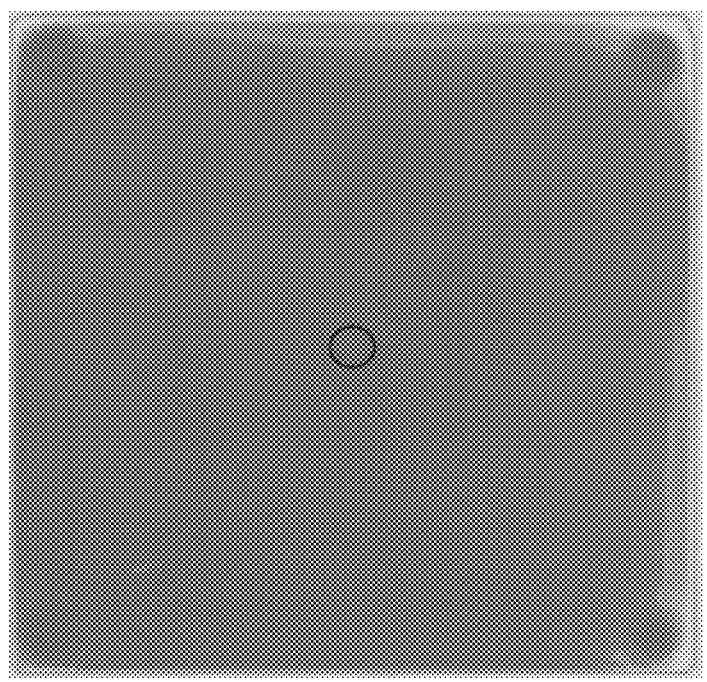
FIGS. 12A and 12B are an optical image and a cross-sectional TE image in accordance with Example 2 of the present invention.
Figure 12B:
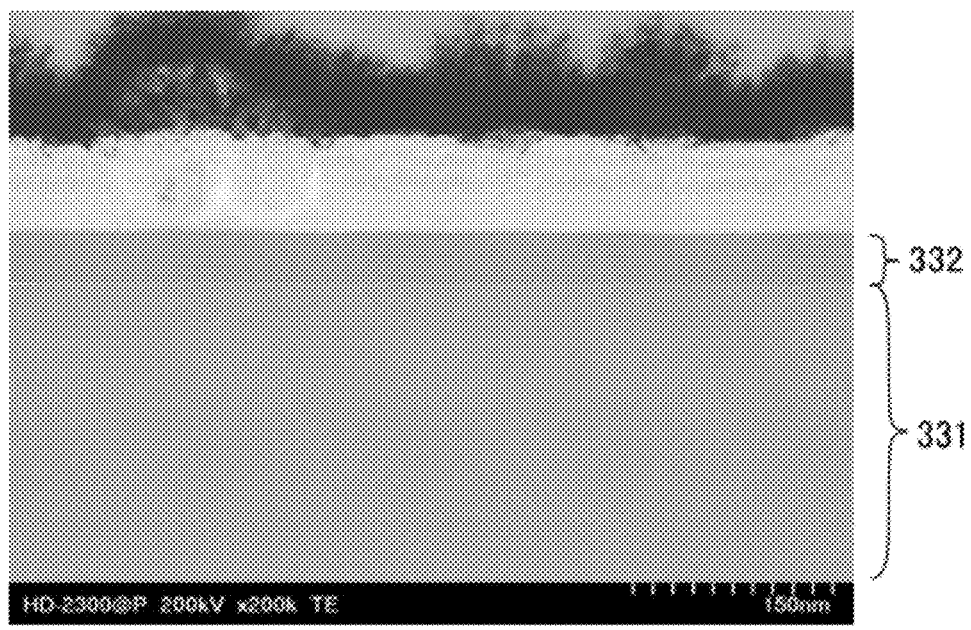
Figure 13A:
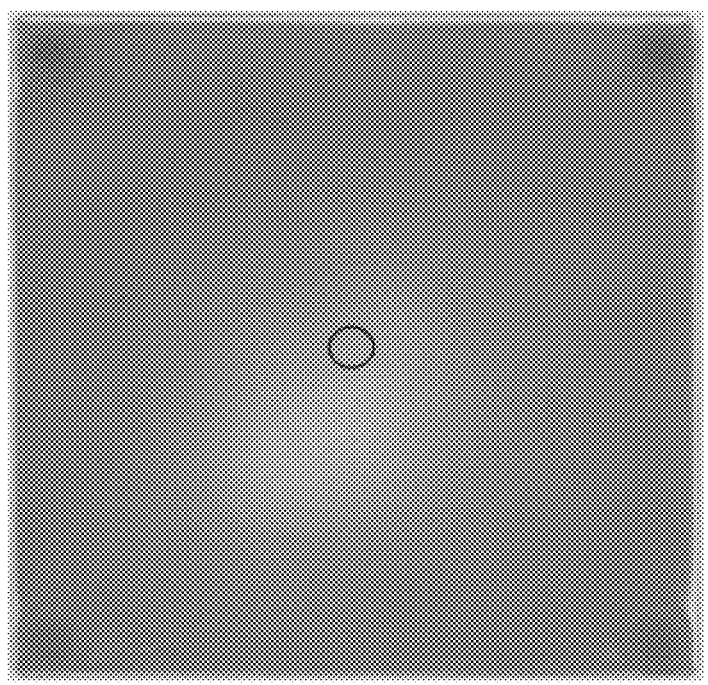
FIGS. 13A and 13B are an optical image and a cross-sectional TE image in accordance with Example 2 of the present invention.
Figure 13B:
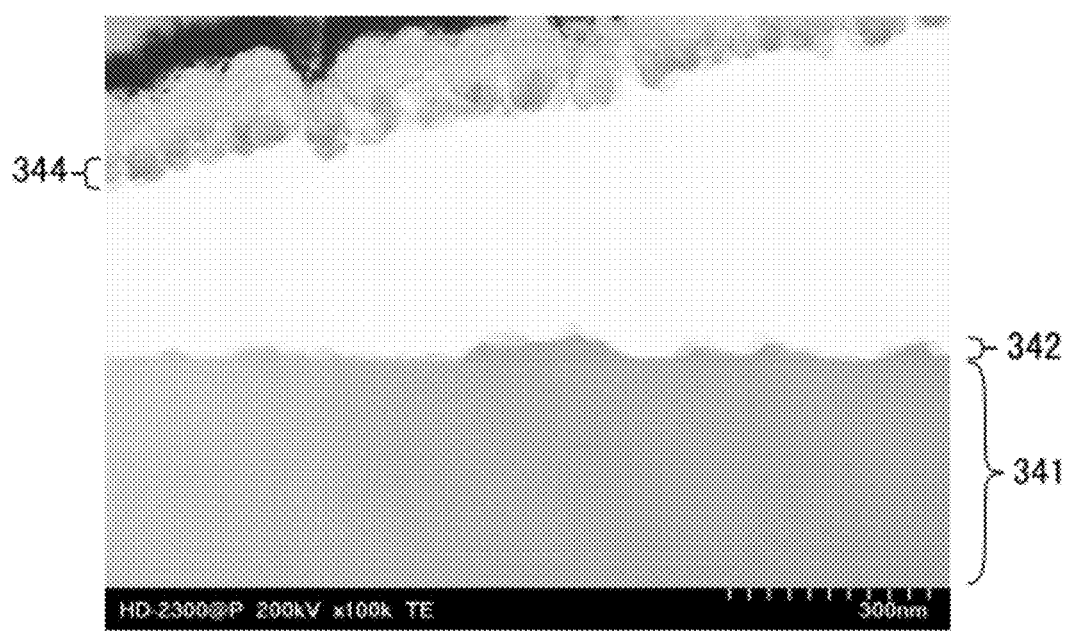
Figure 14A:
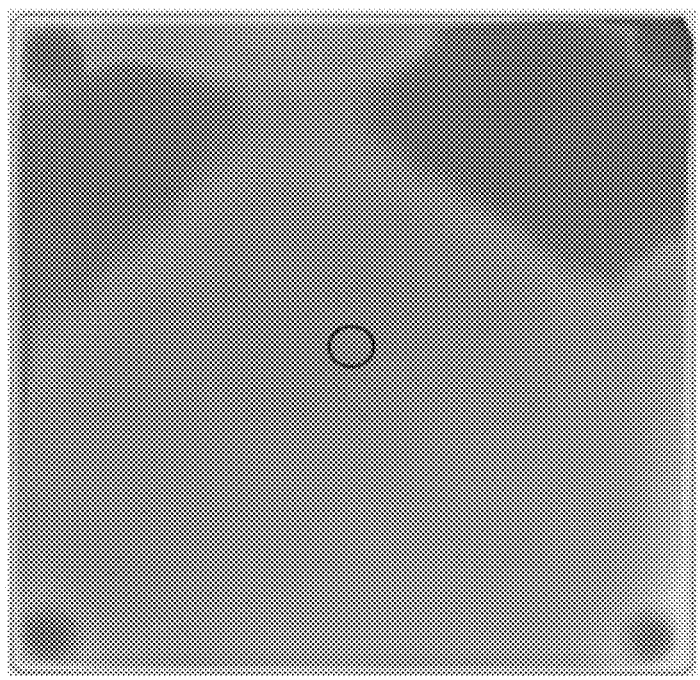
FIGS. 14A and 14B are an optical image and a cross-sectional TE image in accordance with Example 2 of the present invention.
Figure 14B:
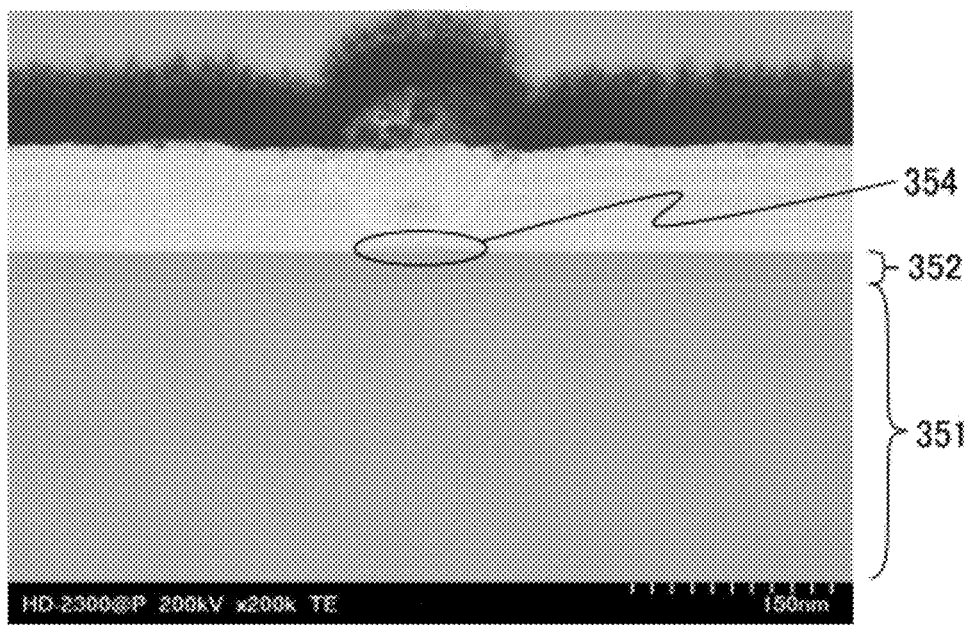
Figure 15A:
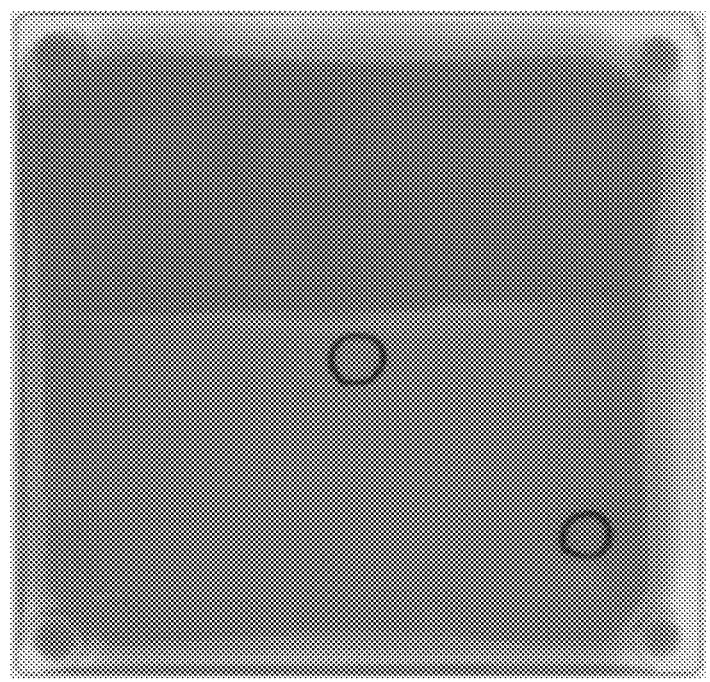
FIGS. 15A and 15B are an optical image and a cross-sectional TE image in accordance with Example 2 of the present invention.
Figure 15B:
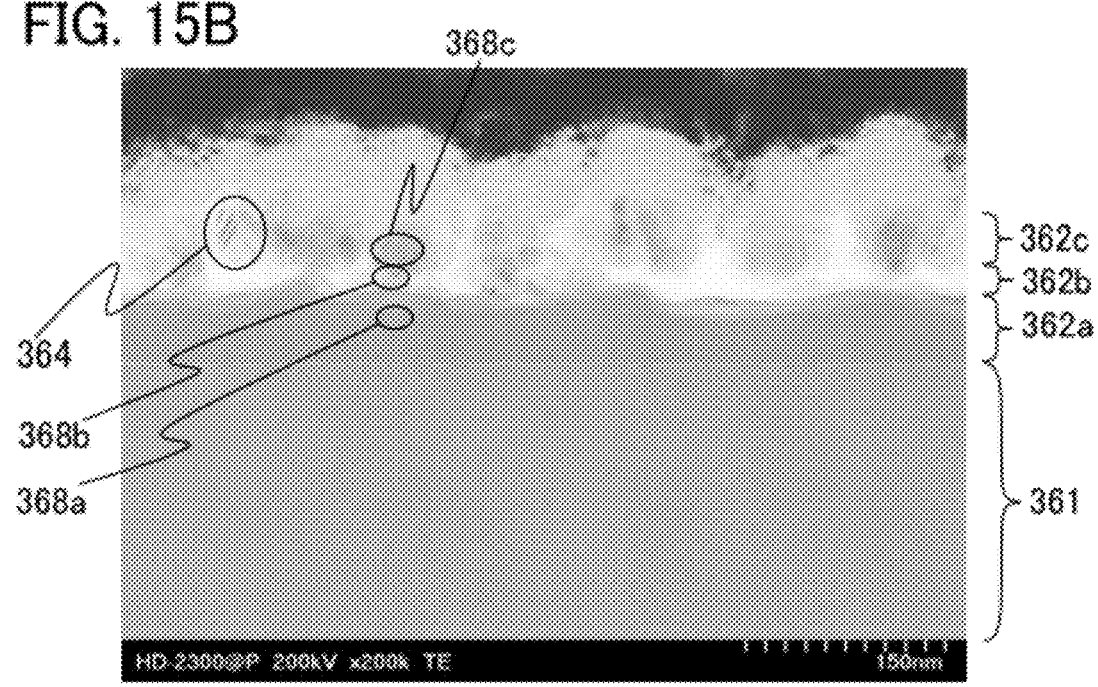
Figure 17:
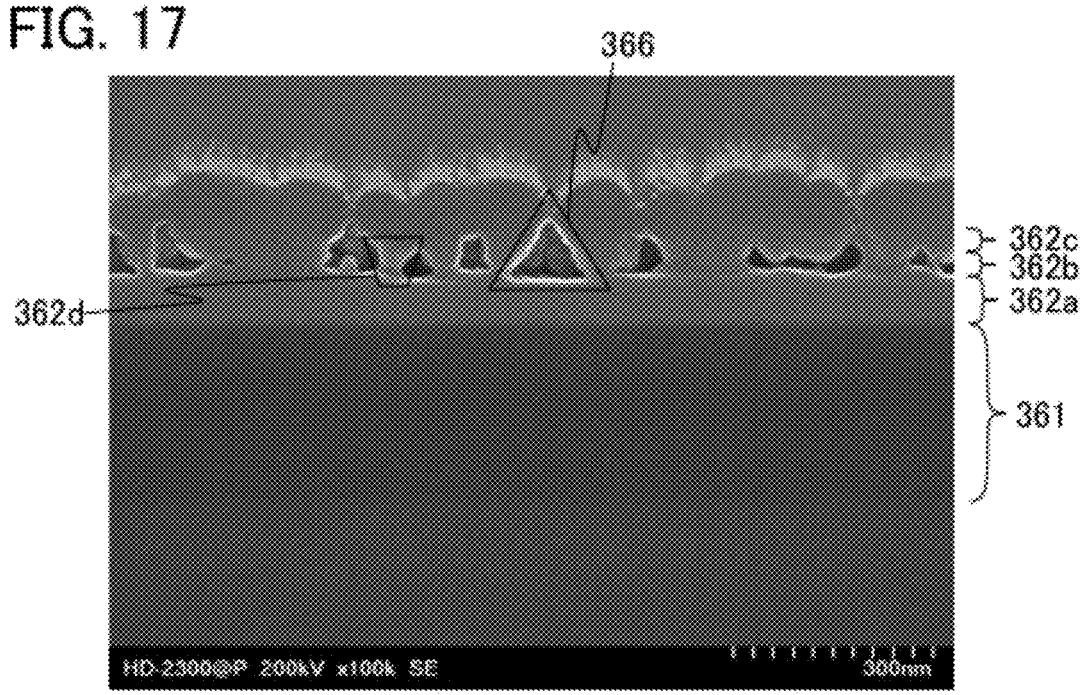
FIG. 17 is a cross-sectional SE image in accordance with Example 2 of the present invention.

FIG. 9A is an optical image of the sample E and FIG. 9B is a TE image (a magnification of 200000 times) of the sample E. FIG. 10A is an optical image of the sample F and FIG. 10B is a TE image (a magnification of 200000 times) of the sample F. FIG. 11A is an optical image of the sample G and FIG. 11B is a TE image (a magnification of 200000 times) of the sample G. FIG. 12A is an optical image of the sample H and FIG. 12B is a TE image (a magnification of 200000 times) of the sample H. FIG. 13A is an optical image of the sample I and FIG. 13B is a TE image (a magnification of 100000 times) of the sample I. FIG. 14A is an optical image of the sample J and FIG. 14B is a TE image (a magnification of 200000 times) of the sample J. FIG. 15A is an optical image of the sample K and FIG. 15B is a TE image (a magnification of 200000 times) of the sample K. FIG. 17 is an SE image (a magnification of 100000 times) of the sample K. Note that the cross-sectional TE images of FIG. 9B, FIG. 10B, FIG. 11B, FIG. 12B, FIG. 13B, FIG. 14B, and FIG. 15B correspond to cross sections of portions surrounded by a circle in the center of the optical images of FIG. 9A, FIG. 10A, FIG. 11A, FIG. 12A, FIG. 13A, FIG. 14A, and FIG. 15A, respectively.

The TE images and the SE images in this example were taken using HD-2300 manufactured by Hitachi High-Technologies Corporation, with an acceleration voltage of 200 kV.

As shown in FIGS. 9A and 9B, the sample E includes a silicon nitride layer 301 over a glass substrate and an amorphous silicon layer 302 which is flat over the silicon nitride layer 301. It can be considered that the samples F to K also have a structure as shown in FIGS. 9A and 9B before the hydrogen plasma treatment is performed. Note that over the amorphous silicon layer 302, a protective film in which a carbon coat and a platinum coat are stacked is provided for taking a TE image. As in the other TE images and SE images, a protective film in which a carbon coat and a platinum coat are stacked is provided over a sample.

It is observed that an amorphous silicon layer in the central portion is removed by the hydrogen plasma treatment in the sample F, as shown in FIG. 10A. It is also observed that the peripheral portion where the amorphous silicon layer is left is brighter than the amorphous silicon layer in the sample A, which means that the thickness of the amorphous silicon layer is decreased. Also in the cross section of the central portion of the sample in FIG. 10B, nothing is formed over a silicon nitride layer 311 over a glass substrate and only a carbon coat and a platinum coat for protection are observed.

In the sample G, as shown in FIGS. 11A and 11B, an amorphous silicon layer 322 which is much thinner than the amorphous silicon layer of the sample A is formed over a silicon nitride layer 321. Most part of the amorphous silicon layer is etched by the hydrogen plasma treatment; however, a portion where an amorphous silicon layer is completely removed as in the sample F is not observed.

In the sample H, as shown in FIGS. 12A and 12B, an amorphous silicon layer 332 with a thickness of about half of that of the amorphous silicon layer 302 of the sample A is formed over the silicon nitride layer 331.

In the sample I, an amorphous silicon layer in the central portion is brighter than the peripheral portion as shown in FIG. 13A. It is supposed that, as shown in FIG. 13B, in the central portion of the sample I, a silicon nitride layer 341 was formed over a glass substrate, an amorphous silicon layer 342 whose thickness is very small was formed over the silicon nitride layer 341, and a microcrystalline silicon layer 344 was formed over the amorphous silicon layer 342; however, the amorphous silicon layer 342 and the microcrystalline silicon layer 344 were separated from each other at the time of TE image taking, because the amorphous silicon layer 342 was too thin.

In the sample J, as shown in FIGS. 14A and 14B, an amorphous silicon layer 352 which is much thinner than the amorphous silicon layer of the sample A is formed over a silicon nitride layer 351. In addition, it is observed that a microcrystalline silicon layer 354 with extremely small thickness is partly formed. This can be also observed from the projected shape of the carbon coat and the platinum coat over the microcrystalline silicon layer 354, which reflects the shape of the microcrystalline silicon layer 354.

As the sample A in Example 1, the sample K in FIG. 15B includes a silicon nitride layer 361 over a glass substrate, an amorphous silicon layer 362a over the silicon nitride layer 361, a lower structure 362b over the amorphous silicon layer 362a, and an upper structure 362c over the lower structure 362b. That is, the sample K includes the silicon structure described in the above embodiment.

In FIG. 15A, contrast is different between the upper half and the lower half of the substrate of the sample K. This is because the upper structure 362c and the lower structure 362b are removed when the upper half of the substrate of the sample K is wiped hard with a nonwoven cloth. Thus, it can be said that the silicon structure of the sample K has higher strength than the silicon structure of the sample I in which the amorphous silicon layer 342 and the microcrystalline silicon layer 344 are separated from each other during a process of image taking.

It is further observed that a microcrystalline silicon layer 364, which is shown by a stripe contrast, is formed on the left side in the upper structure 362c in the TE image of FIG. 15B. It is supposed that an interference stripe due to interference between an electron beam passed through the microcrystalline silicon layer 364 and an electron beam diffracted by a crystal structure with regularity is taken in the image. Accordingly, it is found that the upper structure includes microcrystalline silicon having a crystal structure with regularity. Note that such an interference stripe due to a microcrystalline silicon layer is taken in an image only when the crystal orientation of the microcrystalline silicon layer and an incident direction of an electron beam used in TE image taking correspond to each other. Thus, although the interference stripe is not observed well in the image, microcrystalline silicon is further contained in the upper structure 362c other than the microcrystalline silicon layer 364.

Figure 16A:
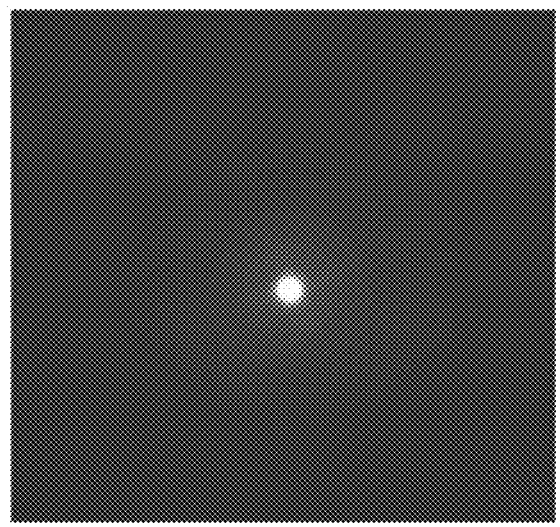
FIGS. 16A to 16C are electron diffraction images in accordance with Example 2 of the present invention.
Figure 16B:
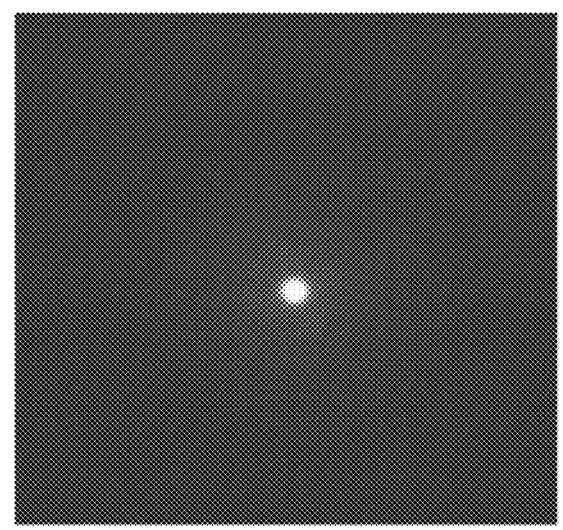
Figure 16C:
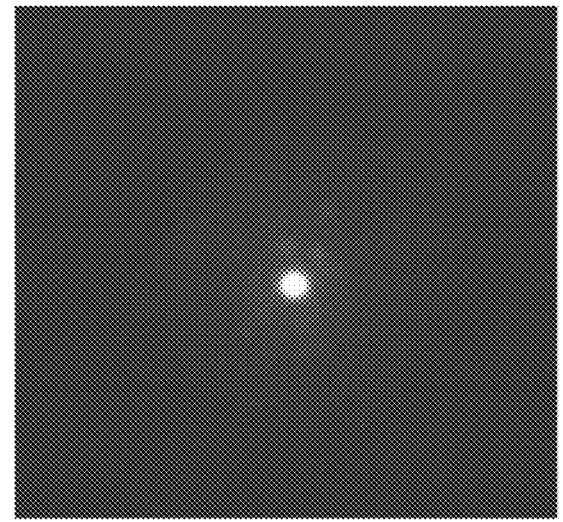

Results of electron diffraction intensity measurement on an amorphous silicon layer 368a, a lower structure 368b, and an upper structure 368c in FIG. 15B are shown in FIGS. 16A to 16C. FIG. 16A is an electron diffraction image of the amorphous silicon layer 368a and shows a concentric circular halo pattern. FIG. 16B is an electron diffraction image of the lower structure 368b and shows a concentric circular halo pattern as FIG. 16A. FIG. 16C is an electron diffraction image of the upper structure 368c and shows a diffraction pattern of a plurality of spots corresponding lattice points, which is different in FIGS. 16A and 16B. Accordingly, it is clearly shown that amorphous silicon is contained in the lower structure 368b and microcrystalline silicon is contained in the upper structure 368c.

FIG. 17 is an SE image of a cross section of the sample K, and as described above, the silicon nitride layer 361, the amorphous silicon layer 362a, the lower structure 362b, and the upper structure 362c are formed. Note that in the SE image, contrast between the upper structure 362c and the carbon coat over the upper structure 362c is small. In an SE image, a secondary electron is detected which is released from a sample surface by an impact of a primary electron applied to the sample surface, so that a contrast is created. Accordingly, a contrast of an SE image is determined according to a surface shape of a sample.

Thus, as shown in FIG. 17, a cavity in the layer in which the lower structure 362b and the upper structure 362c are formed can be clearly observed. In particular, the upper structure can be observed through a cavity 366 in FIG. 17. In a nanostructure 362d in FIG. 17, the upper structure is brighter than the lower structure, which indicates that the upper structure is provided extending beyond the lower structure.

Accordingly, it is found that a nano-structure containing the lower structure 362b over the amorphous silicon layer 362a and the upper structure 362c overlapping with the lower structure 362b is formed in the sample K, and that, in the cross section of the nano-structure, the maximum width of the lower structure 362b in the horizontal direction is smaller than or equal to the maximum width of the upper structure 362c in the horizontal direction.

Comparing the sample F, the sample G, and the sample H whose pressures in the hydrogen plasma treatment are different, the etching amount of an amorphous silicon layer is decreased as the pressure in the hydrogen plasma treatment is increased. Thus, it is supposed that the etching rate of the amorphous silicon layer is decreased as the pressure is increased. In other words, it is supposed that since the hydrogen plasma treatment is performed under high pressure atmosphere as described above, the amorphous silicon layer is prevented from being etched immediately, so that the etching rate of the amorphous silicon layer can be stable.

Comparing the sample F and the sample I, the sample G and the sample J, and the sample H and the sample K, whose powers are different from each other in the hydrogen plasma treatment, a microcrystalline silicon layer is not formed at all in the samples F, G, and H, whereas a microcrystalline silicon layer is formed in at least part of each of the samples I, J, and K. Accordingly, it is supposed that power in the hydrogen plasma treatment is increased and thus sufficient energy is applied to a hydrogen gas in an area where plasma is generated, so that the hydrogen gas can be sufficiently brought into a radical state. Further supposed is a density of a hydrogen gas can be increased between electrodes in the plasma CVD apparatus by increasing the pressure in hydrogen plasma treatment, because a silicon structure is formed in the sample K on which the plasma treatment was performed under high-power and high-pressure atmosphere.

Accordingly, in order to form a silicon structure by performing hydrogen plasma treatment on an amorphous silicon layer, it is preferable that the pressure in a treatment chamber is 5 kPa or more, the power applied to electrodes is 1000 W or more, and the power per electrode area of 1 mm$^2$ is 24.64 mW/mm$^2$ or more. It is further preferable that the pressure in a treatment chamber is 10 kPa or more, the power applied to electrodes is 1300 W or more, and the power per electrode area of 1 mm$^2$ is 32.04 mW/mm$^2$ or more. The plasma treatment is performed under high-power and high-pressure in such a manner; accordingly, a sufficient amount of hydrogen radical is produced, so that the growth rate of microcrystalline silicon at the surface of the amorphous silicon layer 102 can be sufficiently increased.

This application is based on Japanese Patent Application serial no. 2011-017086 filed with Japan Patent Office on Jan. 28, 2011, the entire contents of which are hereby incorporated by reference.

What is claimed is:

1. A semiconductor substrate comprising:
a substrate selected from a glass substrate, a quartz substrate, and a plastic substrate;
an amorphous silicon layer over the substrate;
a structure body over and in contact with the amorphous silicon layer, the structure body comprising a first portion and a second portion over and in direct contact with the first portion,
wherein the first portion and the second portion comprise amorphous silicon and microcrystalline silicon, respectively,
wherein a cross-section of the first portion, which is perpendicular to a top surface of the amorphous silicon layer, has a trapezoidal shape whose shorter base is in contact with the amorphous silicon layer, and
wherein a cross-section of the second portion, which is parallel to the top surface of the amorphous silicon layer, has a round shape whose maximum diameter is longer than a longer base of the trapezoidal shape.

2. The semiconductor substrate according to claim 1, wherein the cross-section of the second portion, which is parallel to the top surface of the amorphous silicon layer and gives the maximum diameter, is spaced from the first portion.

3. The semiconductor substrate according to claim 1, wherein a surface of the second portion, which is spaced from the first portion, is curved.

4. The semiconductor substrate according to claim 1, wherein an impurity element is included in the amorphous silicon layer and the structure body.

5. A capacitor comprising:
an insulating layer over the structure body according to claim 4; and
an electrode layer over the insulating layer.

6. A capacitor comprising:
a first electrode layer over the structure body according to claim 1;
an insulating layer over the first electrode layer; and
a second electrode layer over the insulating layer.

7. A semiconductor substrate comprising:
a substrate selected from a glass substrate, quartz substrate, and a plastic substrate;
an amorphous silicon layer over the substrate; and
first and second structure bodies each in contact with the amorphous silicon layer, each of the first and second structure bodies comprising a first portion and a second portion over and in direct contact with the first portion,
wherein the first portions and the second portions comprise amorphous silicon and microcrystalline silicon, respectively,
wherein, in each of the first and second structure bodies, a cross-section of the first portion, which is perpendicular to a top surface of the amorphous silicon layer, has a trapezoidal shape whose shorter base is in contact with the amorphous silicon layer,
wherein, in each of the first and second structure bodies, a cross-section of the second portion, which is parallel to the top surface of the amorphous silicon layer, has a round shape whose maximum diameter is longer than a longer base of the trapezoidal shape, and
wherein the second portion of the first structure body is in direct contact with the second portion of the second structure body.

8. The semiconductor substrate according to claim 7, wherein, in each of the first and second structure bodies, the cross-section of the second portion, which is parallel to the top surface of the amorphous silicon layer and gives the maximum diameter, is spaced from the first portion.

9. The semiconductor substrate according to claim 7, wherein, in each of the first and second structure bodies, a surface of the second portion, which is spaced from the first portion, is curved.

10. The semiconductor substrate according to claim 7, wherein an impurity element is included in the amorphous silicon layer and the first and second structure bodies.

11. A capacitor comprising:
an insulating layer over the first and second structure bodies according to claim 10; and
an electrode layer over the insulating layer.

12. A capacitor comprising:
a first electrode layer over the first and second structure bodies according to claim 7;
an insulating layer over the first electrode layer; and
a second electrode layer over the insulating layer.

* * * * *